US008211231B2

(12) United States Patent
Kerr et al.

(10) Patent No.: US 8,211,231 B2
(45) Date of Patent: Jul. 3, 2012

(54) DELIVERY DEVICE FOR DEPOSITION

(75) Inventors: Roger S. Kerr, Brockport, NY (US);
David H. Levy, Rochester, NY (US);
James T. Murray, Francher, NY (US)

(73) Assignee: Eastman Kodak Company, Rochester, NY (US)

( * ) Notice: Subject to any disclaimer, the term of this patent is extended or adjusted under 35 U.S.C. 154(b) by 1120 days.

(21) Appl. No.: 11/861,402

(22) Filed: Sep. 26, 2007

(65) Prior Publication Data
US 2009/0081366 A1 Mar. 26, 2009

(51) Int. Cl.
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl. ..... 118/715; 118/728; 118/50; 156/345.33; 156/345.34; 156/345.35; 156/345.36; 156/345.26; 156/345.51

(58) Field of Classification Search ............. 118/715, 118/728, 50; 156/345.33, 345.34, 345.35, 156/345.36, 345.26, 345.51
See application file for complete search history.

(56) References Cited

U.S. PATENT DOCUMENTS

| | | | |
|---|---|---|---|
| 4,413,022 A | | 11/1983 | Suntola et al. |
| 4,590,042 A * | | 5/1986 | Drage .................. 422/186.06 |
| 5,284,519 A * | | 2/1994 | Gadgil ..................... 118/719 |
| 5,380,396 A * | | 1/1995 | Shikida et al. ............... 216/2 |
| 5,422,139 A * | | 6/1995 | Fischer ................... 427/248.1 |
| 5,589,002 A * | | 12/1996 | Su ........................... 118/723 E |
| 5,888,907 A * | | 3/1999 | Tomoyasu et al. ........... 438/714 |
| 5,958,140 A * | | 9/1999 | Arami et al. ................. 118/725 |
| 6,126,753 A * | | 10/2000 | Shinriki et al. .............. 118/715 |
| 6,289,842 B1 * | | 9/2001 | Tompa ..................... 118/723 E |
| 6,432,831 B2 * | | 8/2002 | Dhindsa et al. ............. 438/710 |
| 6,521,048 B2 * | | 2/2003 | Miller et al. ................. 118/729 |
| 6,793,733 B2 * | | 9/2004 | Janakiraman et al. ........ 118/715 |
| 6,800,139 B1 * | | 10/2004 | Shinriki et al. .............. 118/715 |
| 6,821,563 B2 * | | 11/2004 | Yudovsky .................. 427/248.1 |
| 6,830,071 B2 * | | 12/2004 | Xu et al. .................. 137/625.33 |
| 6,890,386 B2 * | | 5/2005 | DeDontney et al. .......... 118/715 |
| 7,456,429 B2 * | | 11/2008 | Levy .............................. 257/66 |
| 7,481,886 B2 * | | 1/2009 | Kato et al. ................... 118/715 |
| 7,572,686 B2 * | | 8/2009 | Levy et al. ................... 438/149 |
| 7,601,223 B2 * | | 10/2009 | Lindfors et al. .............. 118/715 |
| 2001/0004881 A1 * | | 6/2001 | Miller et al. ................. 118/729 |

(Continued)

OTHER PUBLICATIONS

U.S. Appl. No. 11/392,006, filed Mar. 29, 2006, Levy.

(Continued)

*Primary Examiner* — Rudy Zervigon
(74) *Attorney, Agent, or Firm* — William R. Zimmerli

(57) ABSTRACT

A delivery device for thin-film material deposition has at least first, second, and third inlet ports for receiving a common supply for a first, a second and a third gaseous material, respectively. Each of the first, second, and third elongated emissive channels allow gaseous fluid communication with one of corresponding first, second, and third inlet ports. The delivery device can be formed from apertured plates, superposed to define a network of interconnecting supply chambers and directing channels for routing each of the gaseous materials from its corresponding inlet port to a corresponding plurality of elongated emissive channels. The delivery device comprises a diffusing channel formed by a relief pattern between facing plates. Also disclosed is a process for thin film deposition. Finally, more generally, a flow diffuser and a corresponding method of diffusing flow is disclosed.

19 Claims, 22 Drawing Sheets

U.S. PATENT DOCUMENTS

| | | | | |
|---|---|---|---|---|
| 2002/0005442 | A1* | 1/2002 | Watanabe et al. | 239/596 |
| 2003/0027431 | A1* | 2/2003 | Sneh et al. | 438/758 |
| 2004/0067641 | A1* | 4/2004 | Yudovsky | 438/680 |
| 2004/0134611 | A1* | 7/2004 | Kato et al. | 156/345.33 |
| 2004/0250768 | A1* | 12/2004 | Kikuchi et al. | 118/715 |
| 2005/0103265 | A1* | 5/2005 | Gianoulakis et al. | 118/715 |
| 2006/0234514 | A1* | 10/2006 | Gianoulakis et al. | 438/758 |
| 2007/0228470 | A1* | 10/2007 | Levy | 257/348 |
| 2008/0069966 | A1* | 3/2008 | Otsuki | 427/453 |
| 2008/0070032 | A1* | 3/2008 | Otsuki | 428/332 |
| 2008/0166880 | A1* | 7/2008 | Levy | 438/758 |
| 2008/0166884 | A1* | 7/2008 | Nelson et al. | 438/765 |
| 2009/0078204 | A1* | 3/2009 | Kerr et al. | 118/728 |
| 2009/0079328 | A1* | 3/2009 | Fedorovskaya et al. | 313/504 |
| 2009/0081366 | A1* | 3/2009 | Kerr et al. | 427/255.28 |
| 2009/0081842 | A1* | 3/2009 | Nelson et al. | 438/289 |
| 2009/0081883 | A1* | 3/2009 | Freeman et al. | 438/765 |
| 2009/0081885 | A1* | 3/2009 | Levy et al. | 438/778 |
| 2009/0081886 | A1* | 3/2009 | Levy et al. | 438/790 |
| 2009/0095222 | A1* | 4/2009 | Tam et al. | 118/723 R |
| 2009/0130858 | A1* | 5/2009 | Levy | 438/765 |
| 2009/0217878 | A1* | 9/2009 | Levy et al. | 118/729 |

OTHER PUBLICATIONS

U.S. Appl. No. 11/392,007, filed Mar. 29, 2006, Levy.
U.S. Appl. No. 11/620,738, filed Jan. 8, 2007, Levy.
U.S. Appl. No. 11/620,740, filed Jan. 8, 2007, Nelson et al.
U.S. Appl. No. 11/620,744, filed Jan. 8, 2007, Levy.

* cited by examiner

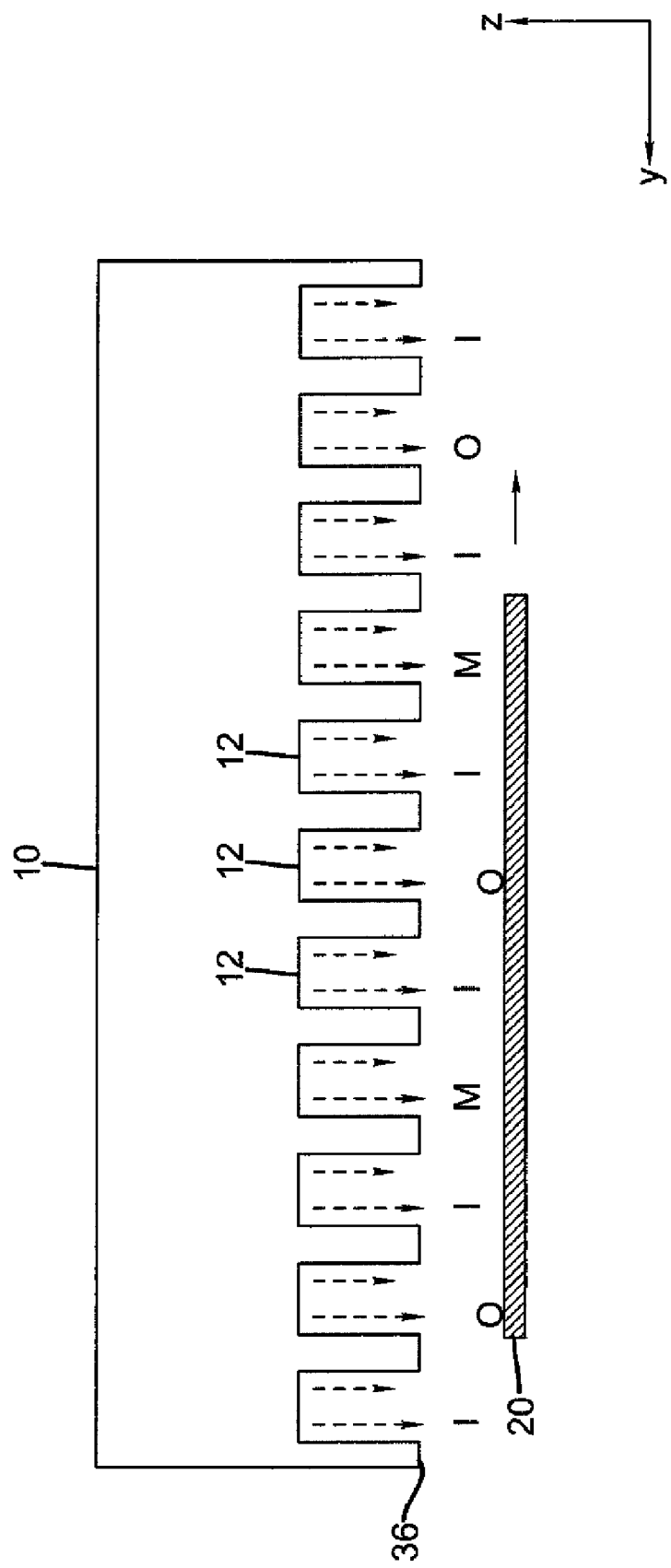

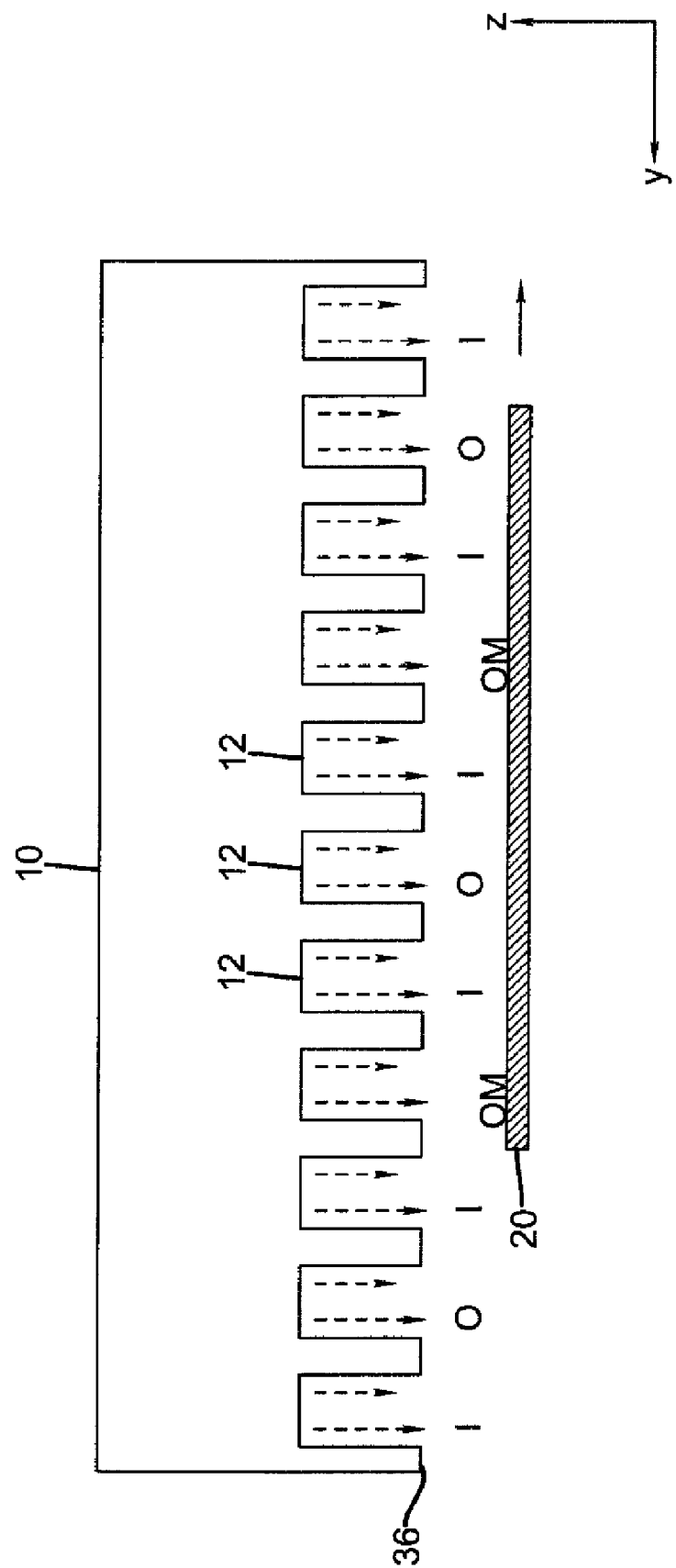

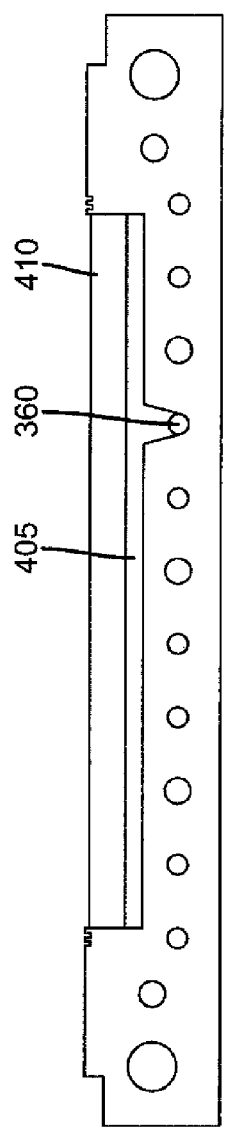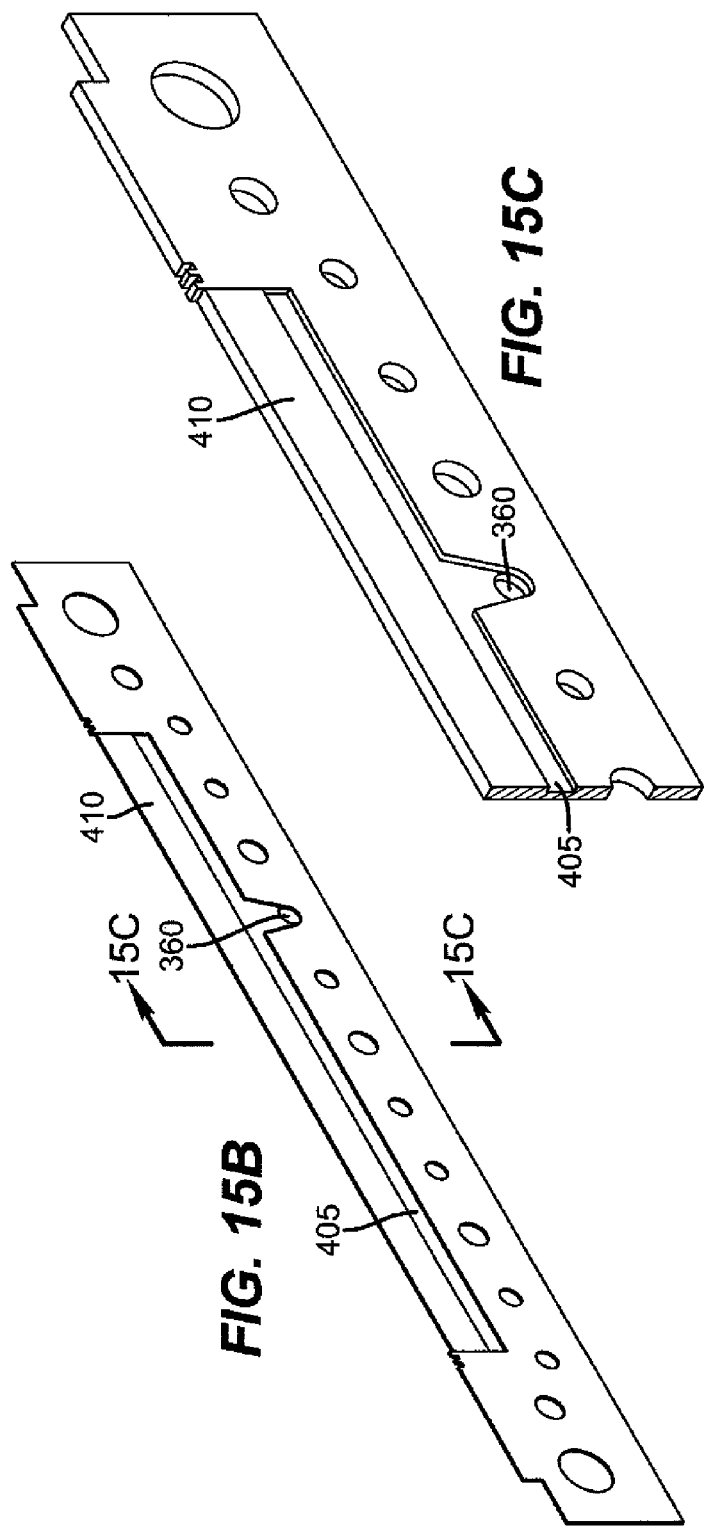

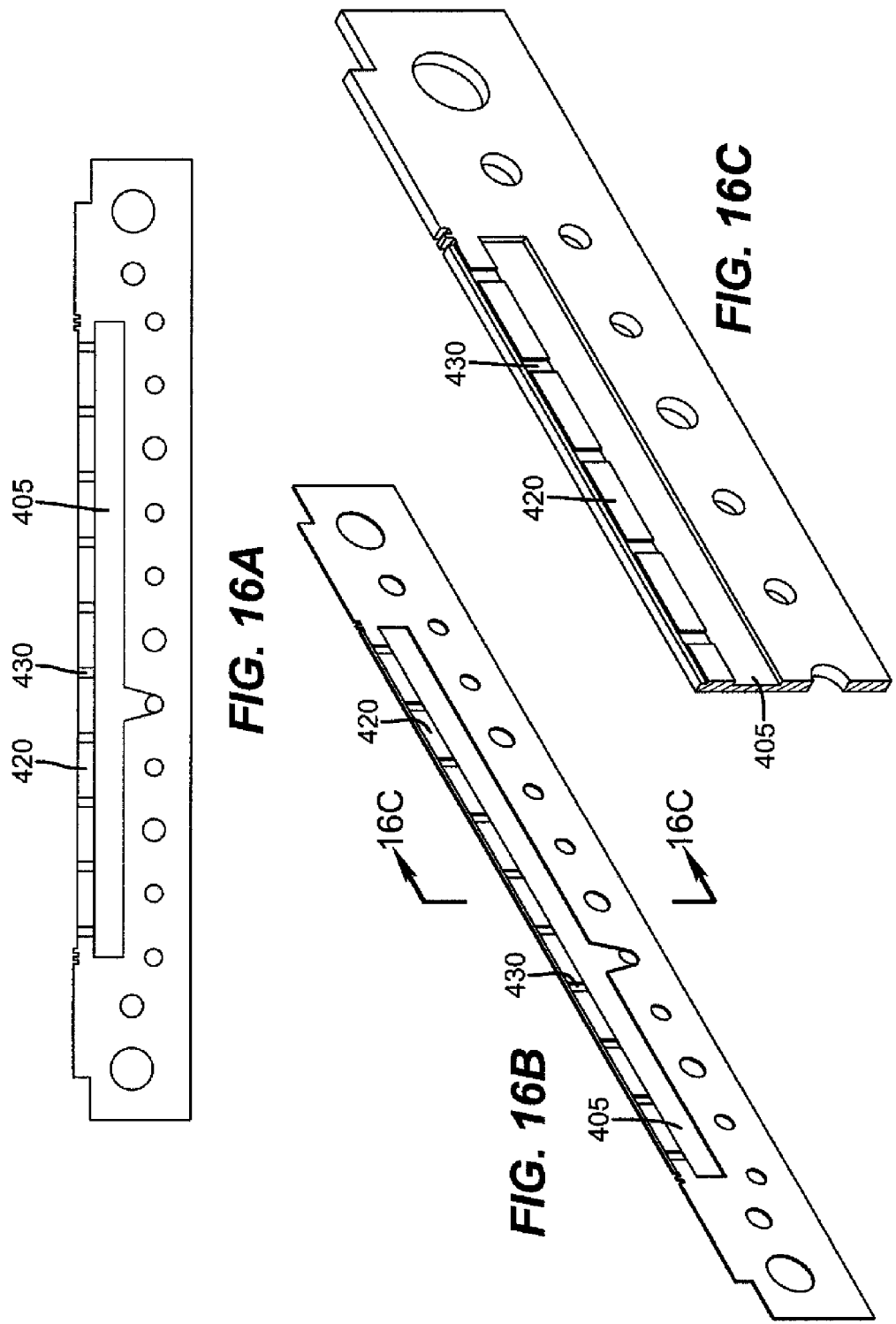

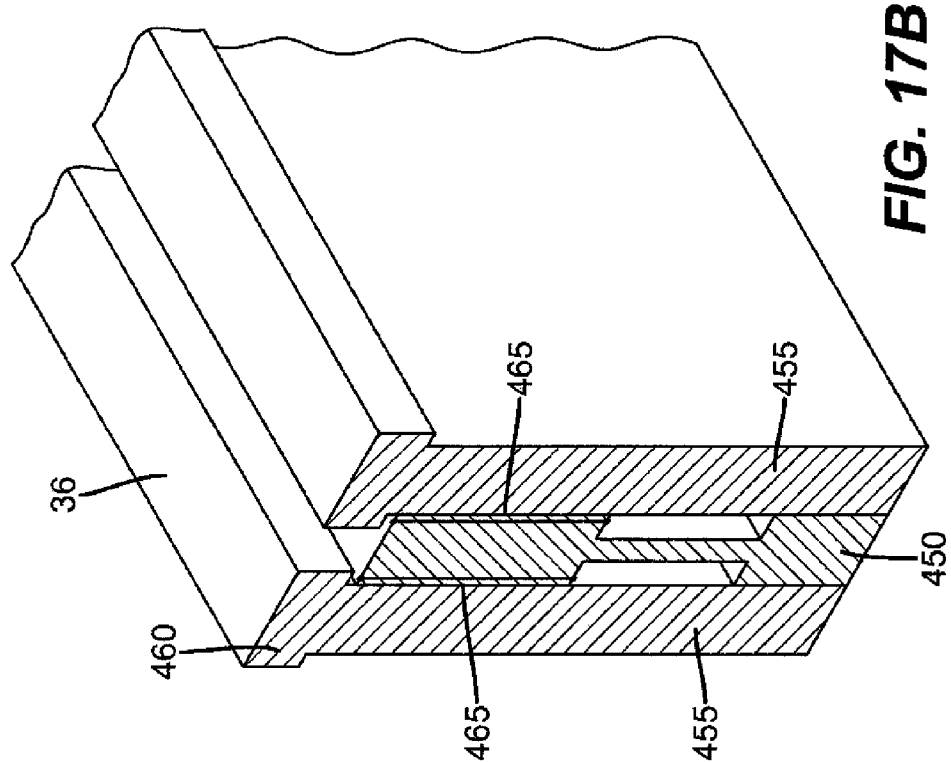
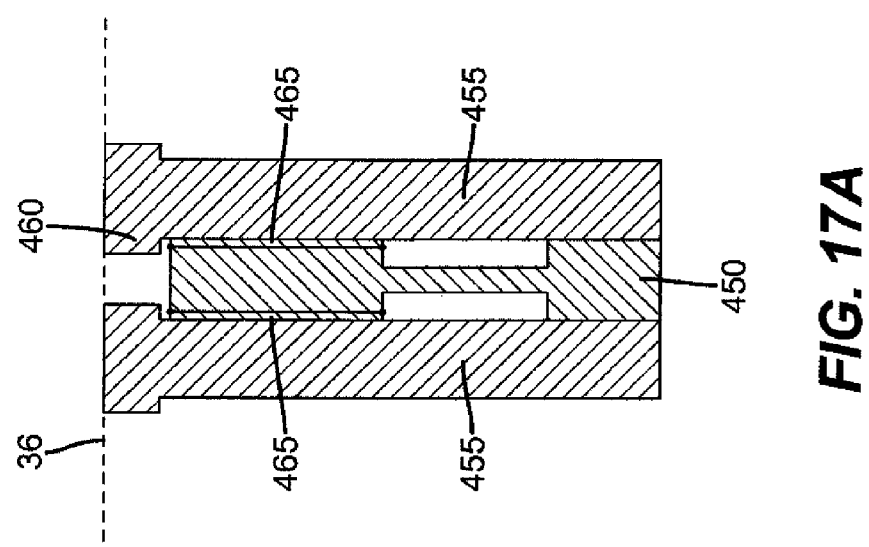
FIG. 17B
FIG. 17A

DELIVERY DEVICE FOR DEPOSITION

CROSS-REFERENCE TO RELATED APPLICATIONS

The present application is related to U.S. Pat. No. 7,413,982 issued Aug. 19, 2008 by Levy and entitled, "PROCESS FOR ATOMIC LAYER DEPOSITION," U.S. Pat. No. 7,456,429 issued Nov. 25, 2008 by Levy and entitled "APPARATUS FOR ATOMIC LAYER DEPOSITION," US Application Publication Number 2008/0166880 published Jul. 10, 2008 by Levy and entitled "DELIVERY DEVICE FOR DEPOSITION," U.S. Pat. No. 7,789,961 issued Sep. 7, 2010 by Nelson et al. and entitled "DELIVERY DEVICE COMPRISING GAS DIFFUSER FOR THIN FILM DEPOSITION," US Application Publication Number 2009/0130858 published May 21, 2009 by Levy and entitled, "DEPOSITION SYSTEM AND METHOD USING A DELIVERY HEAD SEPARATED FROM A SUBSTRATE BY GAS PRESSURE," US Application Publication Number 2009/0078204 published Mar. 26, 2009 by Kerr et al. and entitled, "DEPOSITION SYSTEM FOR THIN FILM FORMATION," U.S. Pat. No. 7,572,686 issued Aug. 11, 2009 by Levy et al. and entitled "SYSTEM FOR THIN FILM DEPOSITION UTILIZING COMPENSATING FORCES," and US. Application Publication Number 2009/0081885 published Mar. 26, 2009 by Levy et al. and entitled, "DEPOSITION SYSTEM FOR THIN FILM FORMATION" all the above identified applications incorporated by reference in their entirety.

FIELD OF THE INVENTION

This invention generally relates diffusing flow of a gaseous or liquid material, especially during the deposition of thin-film materials and, more particularly, to apparatus for atomic layer deposition onto a substrate using a distribution or delivery head directing simultaneous gas flows onto a substrate.

BACKGROUND OF THE INVENTION

Among the techniques widely used for thin-film deposition is Chemical Vapor Deposition (CVD) that uses chemically reactive molecules that react in a reaction chamber to deposit a desired film on a substrate. Molecular precursors useful for CVD applications comprise elemental (atomic) constituents of the film to be deposited and typically also include additional elements. CVD precursors are volatile molecules that are delivered, in a gaseous phase, to a chamber in order to react at the substrate, forming the thin film thereon. The chemical reaction deposits a thin film with a desired film thickness.

Common to most CVD techniques is the need for application of a well-controlled flux of one or more molecular precursors into the CVD reactor. A substrate is kept at a well-controlled temperature under controlled pressure conditions to promote chemical reaction between these molecular precursors, concurrent with efficient removal of byproducts. Obtaining optimum CVD performance requires the ability to achieve and sustain steady-state conditions of gas flow, temperature, and pressure throughout the process, and the ability to minimize or eliminate transients.

Especially in the field of semiconductor, integrated circuit, and other electronic devices, there is a demand for thin films, especially higher quality, denser films, with superior conformal coating properties, beyond the achievable limits of conventional CVD techniques, especially thin films that can be manufactured at lower temperatures.

Atomic layer deposition ("ALD") is an alternative film deposition technology that can provide improved thickness resolution and conformal capabilities, compared to its CVD predecessor. The ALD process segments the conventional thin-film deposition process of conventional CVD into single atomic-layer deposition steps. Advantageously, ALD steps are self-terminating and can deposit one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the absence of the other precursor or precursors of the reaction. In practice, in any system it is difficult to avoid some direct reaction of the different precursors leading to a small amount of chemical vapor deposition reaction. The goal of any system claiming to perform ALD is to obtain device performance and attributes commensurate with an ALD system while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous metal precursor molecule effectively reacts with all of the ligands on the substrate surface, resulting in deposition of a single atomic layer of the metal:

$$\text{substrate-AH} + ML_x \rightarrow \text{substrate-AML}_{x-1} + HL \qquad (1)$$

where HL is a reaction by-product. During the reaction, the initial surface ligands, AH, are consumed, and the surface becomes covered with L ligands, which cannot further react with metal precursor $ML_x$. Therefore, the reaction self-terminates when all of the initial AH ligands on the surface are replaced with $AML_{x-1}$ species. The reaction stage is typically followed by an inert-gas purge stage that eliminates the excess metal precursor from the chamber prior to the separate introduction of a second reactant gaseous precursor material.

The second molecular precursor then is used to restore the surface reactivity of the substrate towards the metal precursor. This is done, for example, by removing the L ligands and redepositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

$$\text{substrate-A-ML} + AH_y \rightarrow \text{substrate-A-M-AH} + HL \qquad (2)$$

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, the basic ALD process requires alternating, in sequence, the flux of chemicals to the substrate. The representative ALD process, as discussed above, is a cycle having four different operational stages:
1. $ML_x$ reaction;
2. $ML_x$ purge;
3. $AH_y$ reaction; and
4. $AH_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all alike in chemical kinetics, deposition per cycle, composition, and thickness.

ALD can be used as a fabrication step for forming a number of types of thin-film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors.

Conductors can be any useful conductive material. For example, the conductors may comprise transparent materials such as indium-tin oxide (ITO), doped zinc oxide ZnO, $SnO_2$, or $In_2O_3$. The thickness of the conductor may vary, and according to particular examples it can range from about 50 to about 1000 nm.

Examples of useful semiconducting materials are compound semiconductors such as gallium arsenide, gallium nitride, cadmium sulfide, intrinsic zinc oxide, and zinc sulfide.

A dielectric material electrically insulates various portions of a patterned circuit. A dielectric layer may also be referred to as an insulator or insulating layer. Specific examples of materials useful as dielectrics include strontiates, tantalates, titanates, zirconates, aluminum oxides, silicon oxides, tantalum oxides, hafnium oxides, titanium oxides, zinc selenide, and zinc sulfide. In addition, alloys, combinations, and multilayers of these examples can be used as dielectrics. Of these materials, aluminum oxides are preferred.

A dielectric structure layer may comprise two or more layers having different dielectric constants. Such insulators are discussed in U.S. Pat. No. 5,981,970 hereby incorporated by reference and copending US Publication No. 2006/0214154, hereby incorporated by reference. Dielectric materials typically exhibit a band-gap of greater than about 5 eV. The thickness of a useful dielectric layer may vary, and according to particular examples it can range from about 10 to about 300 nm.

A number of device structures can be made with the functional layers described above. A resistor can be fabricated by selecting a conducting material with moderate to poor conductivity. A capacitor can be made by placing a dielectric between two conductors. A diode can be made by placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor may be made by placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the necessary interfaces are created.

In typical applications of a thin film transistor, the need is for a switch that can control the flow of current through the device. As such, it is desired that when the switch is turned on, a high current can flow through the device. The extent of current flow is related to the semiconductor charge carrier mobility. When the device is turned off, it is desirable that the current flow be very small. This is related to the charge carrier concentration. Furthermore, it is generally preferable that visible light have little or no influence on thin-film transistor response. In order for this to be true, the semiconductor band gap must be sufficiently large (>3 eV) so that exposure to visible light does not cause an inter-band transition. A material that is capable of yielding a high mobility, low carrier concentration, and high band gap is ZnO. Furthermore, for high-volume manufacture onto a moving web, it is highly desirable that chemistries used in the process are both inexpensive and of low toxicity, which can be satisfied by the use of ZnO and the majority of its precursors.

Self-saturating surface reactions make ALD relatively insensitive to transport non-uniformities, which might otherwise impair surface uniformity, due to engineering tolerances and the limitations of the flow system or related to surface topography (that is, deposition into three dimensional, high aspect ratio structures). As a general rule, a non-uniform flux of chemicals in a reactive process generally results in different completion times over different portions of the surface area. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the full treated surface undergoes the intended reaction.

Typically, an ALD process deposits about 0.1-0.2 nm of a film in a single ALD cycle (with one cycle having numbered steps 1 through 4 as listed earlier). A useful and economically feasible cycle time must be achieved in order to provide a uniform film thickness in a range of from about 3 nm to 30 nm for many or most semiconductor applications, and even thicker films for other applications. According to industry throughput standards, substrates are preferably processed within 2 minutes to 3 minutes, which means that ALD cycle times must be in a range from about 0.6 seconds to about 6 seconds.

ALD offers considerable promise for providing a controlled level of highly uniform thin film deposition. However, in spite of its inherent technical capabilities and advantages, a number of technical hurdles still remain. One important consideration relates to the number of cycles needed. Because of its repeated reactant and purge cycles, effective use of ALD has required an apparatus that is capable of abruptly changing the flux of chemicals from $ML_x$ to $AH_y$, along with quickly performing purge cycles. Conventional ALD systems are designed to rapidly cycle the different gaseous substances onto the substrate in the needed sequence. However, it is difficult to obtain a reliable scheme for introducing the needed series of gaseous formulations into a chamber at the needed speeds and without some unwanted mixing. Furthermore, an ALD apparatus must be able to execute this rapid sequencing efficiently and reliably for many cycles in order to allow cost-effective coating of many substrates.

In an effort to minimize the time that an ALD reaction needs to reach self-termination, at any given reaction temperature, one approach has been to maximize the flux of chemicals flowing into the ALD reactor, using so-called "pulsing" systems. In order to maximize the flux of chemicals into the ALD reactor, it is advantageous to introduce the molecular precursors into the ALD reactor with minimum dilution of inert gas and at high pressures. However, these measures work against the need to achieve short cycle times and the rapid removal of these molecular precursors from the ALD reactor. Rapid removal in turn dictates that gas residence time in the ALD reactor be minimized. Gas residence times, $\tau$, are proportional to the volume of the reactor, V, the pressure, P, in the ALD reactor, and the inverse of the flow, Q, that is:

$$\tau = VP/Q \qquad (3)$$

In a typical ALD chamber the volume (V) and pressure (P) are dictated independently by the mechanical and pumping constraints, leading to difficulty in precisely controlling the residence time to low values. Accordingly, lowering pressure (P) in the ALD reactor facilitates low gas residence times and increases the speed of removal (purge) of chemical precursor from the ALD reactor. In contrast, minimizing the ALD reaction time requires maximizing the flux of chemical precursors into the ALD reactor through the use of a high pressure within the ALD reactor. In addition, both gas residence time and chemical usage efficiency are inversely proportional to the flow. Thus, while lowering flow can increase efficiency, it also increases gas residence time.

Existing ALD approaches have been compromised with the trade-off between the need to shorten reaction times with improved chemical utilization efficiency, and, on the other hand, the need to minimize purge-gas residence and chemical removal times. One approach to overcome the inherent limitations of "pulsed" delivery of gaseous material is to provide each reactant gas continuously and to move the substrate through each gas in succession. For example, U.S. Pat. No. 6,821,563 entitled "GAS DISTRIBUTION SYSTEM FOR CYCLICAL LAYER DEPOSITION" to Yudovsky, describes a processing chamber, under vacuum, having separate gas ports for precursor and purge gases, alternating with vacuum pump ports between each gas port. Each gas port directs its stream of gas vertically downward toward a substrate. The separate gas flows are separated by walls or partitions, with vacuum pumps for evacuating gas on both sides of each gas stream. A lower portion of each partition extends close to the substrate, for example, about 0.5 mm or greater from the substrate surface. In this manner, the lower portions of the partitions are separated from the substrate surface by a distance sufficient to allow the gas streams to flow around the lower portions toward the vacuum ports after the gas streams react with the substrate surface.

A rotary turntable or other transport device is provided for holding one or more substrate wafers. With this arrangement, the substrate is shuttled beneath the different gas streams, effecting ALD deposition thereby. In one embodiment, the substrate is moved in a linear path through a chamber, in which the substrate is passed back and forth a number of times.

Another approach using continuous gas flow is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, again, without the need for pulsed operation. In the embodiment of FIGS. 13 and 14, in particular, sequential interactions between a substrate surface and reactive vapors are made by a reciprocating motion of the substrate over a fixed array of source openings. Diffusion barriers are formed by having a carrier gas opening between exhaust openings. Suntola et al. state that operation with such an embodiment is possible even at atmospheric pressure, although little or no details of the process, or examples, are provided.

While systems such as those described in the '563 Yudovsky and '022 Suntola et al. patents may avoid some of the difficulties inherent to pulsed gas approaches, these systems have other drawbacks. Neither the gas flow delivery unit of the '563 Yudovsky patent nor the gas flow array of the '022 Suntola et al. patent can be used in closer proximity to the substrate than about 0.5 mm. Neither of the gas flow delivery apparatus disclosed in the '563 Yudovsky and '022 Suntola et al. patents are arranged for possible use with a moving web surface, such as could be used as a flexible substrate for forming electronic circuits, light sensors, or displays, for example. The complex arrangements of both the gas flow delivery unit of the '563 Yudovsky patent and the gas flow array of the '022 Suntola et al. patent, each providing both gas flow and vacuum, make these solutions difficult to implement, costly to scale, and limit their potential usability to deposition applications onto a moving substrate of limited dimensions. Moreover, it would be very difficult to maintain a uniform vacuum at different points in an array and to maintain synchronous gas flow and vacuum at complementary pressures, thus compromising the uniformity of gas flux that is provided to the substrate surface.

US Patent Publication No. 2005/0084610 to Selitser discloses an atmospheric pressure atomic layer chemical vapor deposition process. Selitser state that extraordinary increases in reaction rates are obtained by changing the operating pressure to atmospheric pressure, which will involve orders of magnitude increase in the concentration of reactants, with consequent enhancement of surface reactant rates. The embodiments of Selitser involve separate chambers for each stage of the process, although FIG. 10 in 2005/0084610 shows an embodiment in which chamber walls are removed. A series of separated injectors are spaced around a rotating circular substrate holder track. Each injector incorporates independently operated reactant, purging, and exhaust gas manifolds and controls and acts as one complete mono-layer deposition and reactant purge cycle for each substrate as is passes there under in the process. Little or no specific details of the gas injectors or manifolds are described by Selitser, although they state that spacing of the injectors is selected so that cross-contamination from adjacent injectors is prevented by purging gas flows and exhaust manifolds incorporated in each injector.

A particularly useful method to provide for the isolation of mutually reactive ALD gases is the gas bearing ALD device of the above-cited U.S. patent application Ser. No. 11/620,738. The efficiency of this device arises from the fact that relatively high pressures are generated in the gap between the deposition head and the substrate, which force gases in a well-defined path from a source area to an exhaust region while in proximity to the substrate experiencing deposition.

In all of the systems mentioned above, it is imperative to have an effective method of diffusing a gas along a linear opening. Likewise, it is very important for the exhaust channels to pull gases from the coating deposition area uniformly. As such, all of these systems require a diffuser element that can take gas originally flowing in a narrow supply line and cause it to exit over a large linear exit area in a very uniform way. It is also important to accomplish the construction of the diffuser element in a cost effective way employing a minimum of mechanical components.

OBJECT OF THE INVENTION

An object of the present invention is, when placing reactive gases in close proximity in an ALD coating process, to deliver gases in a relatively precise way, with good uniformity over the dimensions of a delivery head.

Another object of the present invention is to diffuse the gases while maintaining channel separation during simultaneous gas flow.

Another object is, in providing this uniformity, to produce a uniform backpressure over an extended area of an output channel, thus diffusing the flow of the gas.

Another object is to provide efficient and easy-to-assemble diffuser systems for a delivery head.

Another object is to allow a single assembly process to produce both the internal supply lines and the diffuser element of a delivery head.

Another object is to provide an ALD deposition method and apparatus that can be used with a continuous process and that can provide improved gas flow separation over earlier solutions.

Another object is to provide an ALD deposition method and apparatus that is more robust to potential disturbances or irregularities in process conditions or circumstances during operation.

SUMMARY OF THE INVENTION

The present invention provides an apparatus and process for depositing a thin film material on a substrate, comprising simultaneously directing a series of gas flows from the output face of a delivery device of a thin film deposition system toward the surface of a substrate, wherein the series of gas flows comprises at least a first reactive gaseous material, an inert purge gas, and a second reactive gaseous material. The first reactive gaseous material is capable of reacting with a substrate surface treated with the second reactive gaseous material. In particular, the present invention relates to a delivery device having an output face for providing gaseous materials for thin-film material deposition onto a substrate comprising:
  (a) a plurality of inlet ports comprising at least a first, a second, and a third inlet port for receiving a first, a second, and a third gaseous material, respectively; and
  (b) an output face separated a distance from the substrate and comprising a plurality of substantially parallel elongated output openings, wherein said delivery head is designed to deliver the first, the second, and the third gaseous materials simultaneously from the elongated output openings in the output face to the substrate; and
  (c) a network of interconnecting supply chambers and directing channels for routing each of the first, second, and third gaseous materials from its corresponding inlet port to its corresponding elongated output openings;
  wherein at least one gas diffusing channel that is formed by two adjacent plates in which at least one of the two plates has a relief pattern in the area of the gas diffusing channel is associated with at least one of the plurality of substantially parallel elongated output openings.

Thus, the delivery device can comprise a single first elongated output opening, a single second elongated output opening, and a single third elongated output opening, although a plurality (two or more) of each are preferred, as described below. Accordingly, preferably the output face is separated a distance from the substrate and comprises a first, second, and third plurality of substantially parallel elongated output openings, associated with each of the first, second and third inlet port, respectively, wherein the delivery head is designed to deliver the first, the second, and the third gaseous materials simultaneously from the elongated output openings in the output face to the substrate. The network of interconnecting supply chambers and directing channels routes each of the first, second, and third gaseous materials from its corresponding inlet port to its corresponding elongated output openings, preferably through corresponding elongated emissive channels as described further below, wherein each elongated output opening, in the face of the delivery head, is associated with an elongated emissive channel comprising, or prior to, the elongated outlet opening.

In one embodiment of a process according to the present invention, the first and second gaseous materials can be mutually reactive gases, and the third gaseous material can be a purge gas such as nitrogen. In one embodiment, the first, second, and third elongated emissive channels can be output channels that are capable of providing the first gaseous material, second gaseous material, and third gaseous material, respectively, directly from the output face to the substrate, without an intermediate diffuser element. In an alternative embodiment, the respective elongated emissive channels can provide the first gaseous material, second gaseous material, and third gaseous material indirectly to the substrate to be treated after separately passing through a gas diffuser element that comprises output channels in the output face of the delivery device.

According to another aspect of the invention, a process for depositing a thin film material on a substrate comprises simultaneously directing a series of gas flows from the output face of a delivery head of a thin film deposition system toward the surface of a substrate, wherein the series of gas flows comprises at least a first reactive gaseous material, an inert purge gas, and a second reactive gaseous material, wherein the first reactive gaseous material is capable of reacting with a substrate surface treated with the second reactive gaseous material, wherein the delivery head comprises:
  (a) at least a first, a second, and a third inlet port for receiving the first reactive gaseous material, the second reactive gaseous material, and the inert purge gas, respectively;
  (b) an output face in proximity to the substrate surface comprising a plurality of elongated openings, wherein each of the inlet ports is independently connected, respectively, to at least one first, second, and third elongated output opening for supplying the respective gaseous materials to the substrate; and
  (c) a network of interconnecting supply chambers and directing channels for routing each of the first, second, and third gaseous materials from its corresponding inlet port to its corresponding elongated output opening;
wherein at least one gas diffusing channel, formed by two adjacent plates in which at least one of the two plates has a relief pattern in the area of the gas diffusing channel, is associated with at least one of the substantially parallel elongated output openings.

Still another aspect of the present invention, more generally, relates to a process of assembling a delivery head for thin-film material deposition onto a substrate comprising:

(a) fabricating a series of plates at least a portion thereof containing relief patterns for forming a diffuser element; and (b) attaching the plates to each other in sequence so as to form a network of supply lines connected to one or more diffuser elements.

Finally, another aspect of the present invention relates to a flow diffuser, and a corresponding method, comprising (a) a first plate having a relief pattern portion; and (b) a second plate; wherein the first plate and the second plate are assembled to form an elongated output opening with a flow diffusing portion defined by the relief pattern portion, wherein flow diffusing portion is capable of diffusing the flow of a gaseous or liquid material. The corresponding method of diffusing the flow of a gaseous or liquid material comprises passing the gaseous or liquid material through a flow diffusing portion defined by the relief pattern portion formed by assembling a first plate having a relief pattern portion and a second plate, wherein the relief pattern portion is between facing plates and connects an elongated inlet opening and an elongated output opening for the flow of the gaseous or liquid material. Preferably, the delivery head comprises a plurality of first elongated emissive channels and/or a plurality of second elongated emissive channels for various applications. However, as a minimum, a one-stage delivery head can have, for example, only one metal and or one oxidizer channel in combination with at least two purge channels. A plurality of individual "delivery-head sub-units" that are connected together, or that are transported in sync during thin-film deposition onto a substrate, or that treat the same substrate during a common period of time are considered a "delivery head" for the purpose of the present invention, even though separately constructed or separable after deposition.

In one embodiment, the apertured plates are disposed substantially in parallel to the output face, and apertures on at least one of the apertured plates form the first, second, and third elongated emissive channels. In an alternative embodiment, the apertured plates are substantially perpendicularly disposed with respect to the output face.

In one embodiment, one or more of the gas flows provides a pressure that at least contributes to the separation of the surface of the substrate from the face of the delivery device.

In another embodiment, the system provides a relative oscillating motion between the distribution head and the substrate. In a preferred embodiment, the system can be operated with continuous movement of a substrate being subjected to thin film deposition, wherein the system is capable of conveying the support on or as a web past the distribution head, preferably in an unsealed environment to ambient at substantially atmospheric pressure.

It is an advantage of the present invention that it can provide a compact apparatus for atomic layer deposition onto a substrate that is well suited to a number of different types of substrates and deposition environments.

It is a further advantage of the present invention that it allows operation, in preferred embodiments, under atmospheric pressure conditions.

It is yet a further advantage of the present invention that it is adaptable for deposition on a web or other moving substrate, including deposition onto a large area substrate.

It is still a further advantage of the present invention that it can be employed in low temperature processes at atmospheric pressures, which process may be practiced in an unsealed environment, open to ambient atmosphere.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIGS. 5A and 5B are cross-sectional side views of one embodiment of a delivery device, schematically showing the accompanying deposition operation;

FIGS. 15A through 15C show plan, perspective, and perspective sectioned views, respectively, of a source plate containing relief patterns for use in a perpendicular plate orientation design;

FIGS. 16A through 16C show plan, perspective, and perspective sectioned views, respectively, of a source plate containing a coarse relief pattern for use in a perpendicular plate orientation design;

FIGS. 17A and 17B show a relief containing plate with sealing plates that contain a deflection in order to prevent gas that exits for diffuser from impinging directly on the substrate.

DETAILED DESCRIPTION OF THE INVENTION

The present description is directed in particular to diffusing elements forming part of, or cooperating within, an apparatus in accordance with the invention that delivers a fluid material to a substrate. It is to be understood that elements not specifically shown or described may take various forms well known to those skilled in the art.

More particularly, this invention relates to a means of diffusing a gas flow from a source channel so that it exits uniformly over a longer linear region. While this method may be applied to a broad range of technologies, one important application is in the field of spatially dependent ALD.

To suitably diffuse a flow of gas, an element that provides uniform flow backpressure over a linear region must be devised. In order to provide a restriction of flow, a channel needs to be created in which the open cross-section available for flow is very small. To provide suitable backpressures, the open cross-section for flow should have openings that are less than 100,000 $\mu m^2$, preferably less than 10,000 $\mu m^2$.

Figures 1A, 1B, 1C, 1D:
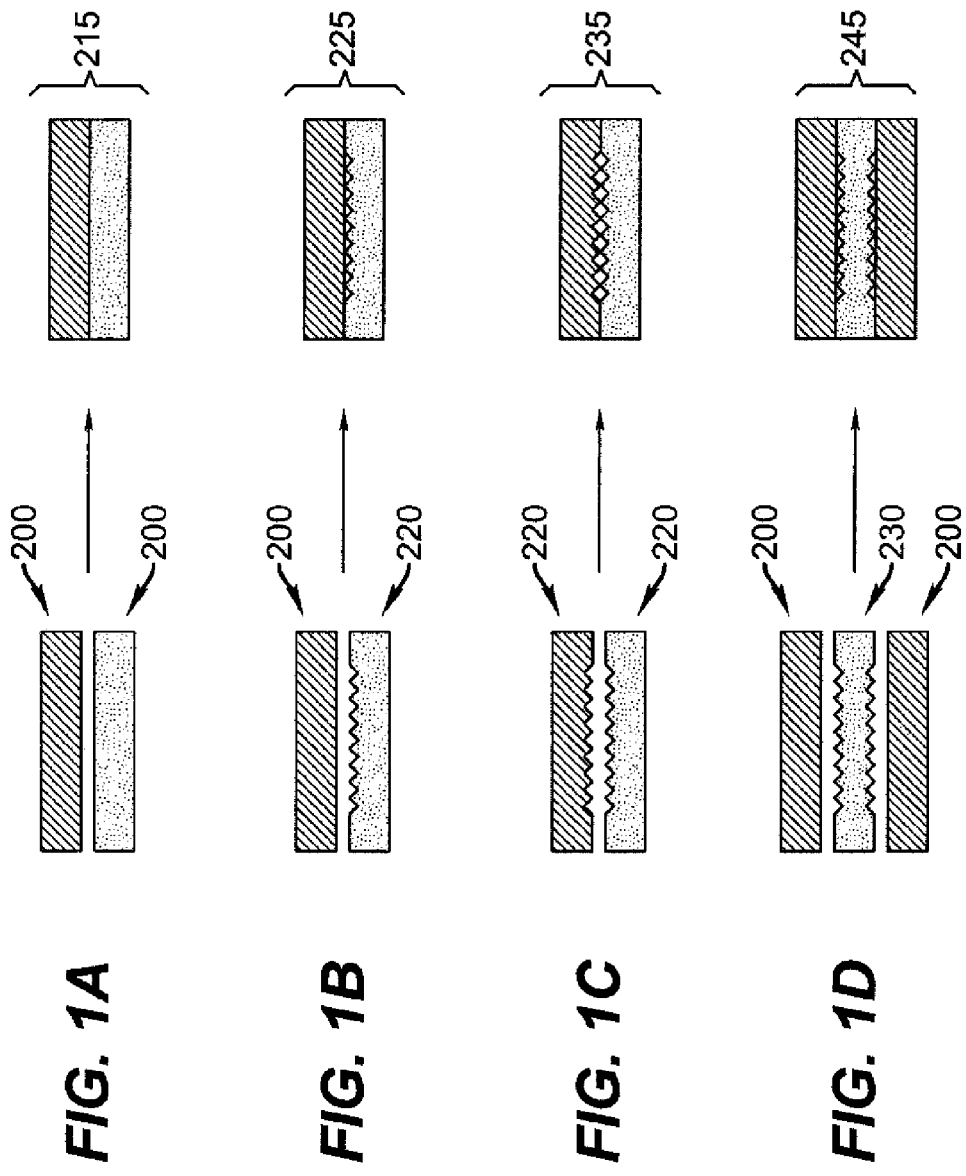
FIGS. 1A through 1D show diagrammatic depictions of the assembly of plates containing relief patterns to form microchannel diffusing elements.

Referring to FIG. 1A, if two perfectly flat plates 200 are assembled together, these plates will seal against each other to form assembled plate unit 215. If an attempt is made to flow gas in a direction perpendicular to the drawing, the assembled plate unit 215 will not allow the passage of a gas.

Alternatively, one or the both of the plates may have regions with small or microscopic height variations, where the maximum height is level with the main or an original height of the plate. The region of height variations can be referred to as a relief pattern. When plate assemblies are made using plates with a relief pattern, microchannels are formed that results in a flow restriction.

For example in FIG. 1B a single flat plate 200 can be mated to a plate 220 containing a relief pattern in a portion of its surface. When these two plates are combined to form assembled plate unit 225, a restrictive opening is formed by contact of the plates. FIGS. 1C and 1D show respectively that two plates containing relief patterns 200 or a plate 230 with relief patterns on both sides and be assembled to produce various diffuser patterns such as assembled plate units 235 and 245.

The relief pattern may consist of any structure that when assembled provides a desired flow restriction. One example would be simple roughening selected areas of a plate. These can be produced by non-directed roughening methods, such as sanding, sandblasting, or etching processes designed to produce a rough finish.

Alternatively, the area of the micro-channels can be produced by a process producing well-defined or pre-defined features. Such processes include patterning by embossing or stamping. A preferred method of patterning involves photo-etching of the part in which a photoresist pattern can be applied and then etching of the metal in the areas where the photoresist is not present. This process can be done several times on a single part in order to provide patterns of different depth as well as to singulate the part from a larger metal sheet.

The parts can also be made by deposition of material onto a substrate. In such a composition, a starting flat substrate plate can be made from any suitable material. A pattern can then be built up on this plate by patterned deposition of materials. The material deposition can be done with optical patterning, such as by applying a uniform coating of an optically sensitive material like a photoresist and then patterning the materials using a light based method with development. The material for relief can also be applied by an additive printed method such as inkjet, gravure, or screen printing.

Direct molding of the parts can also be accomplished. This technique is particularly suitable for polymeric materials, in which a mold of the desired plate can be made and then parts produced using any of the well understood methods for polymer molding.

The plates of the current invention are characterized that they are substantially flat structures, varying in thickness from about 0.001 inch to 0.5 inch with relief patterns existing in one or both sides of the plates.

Figure 2:
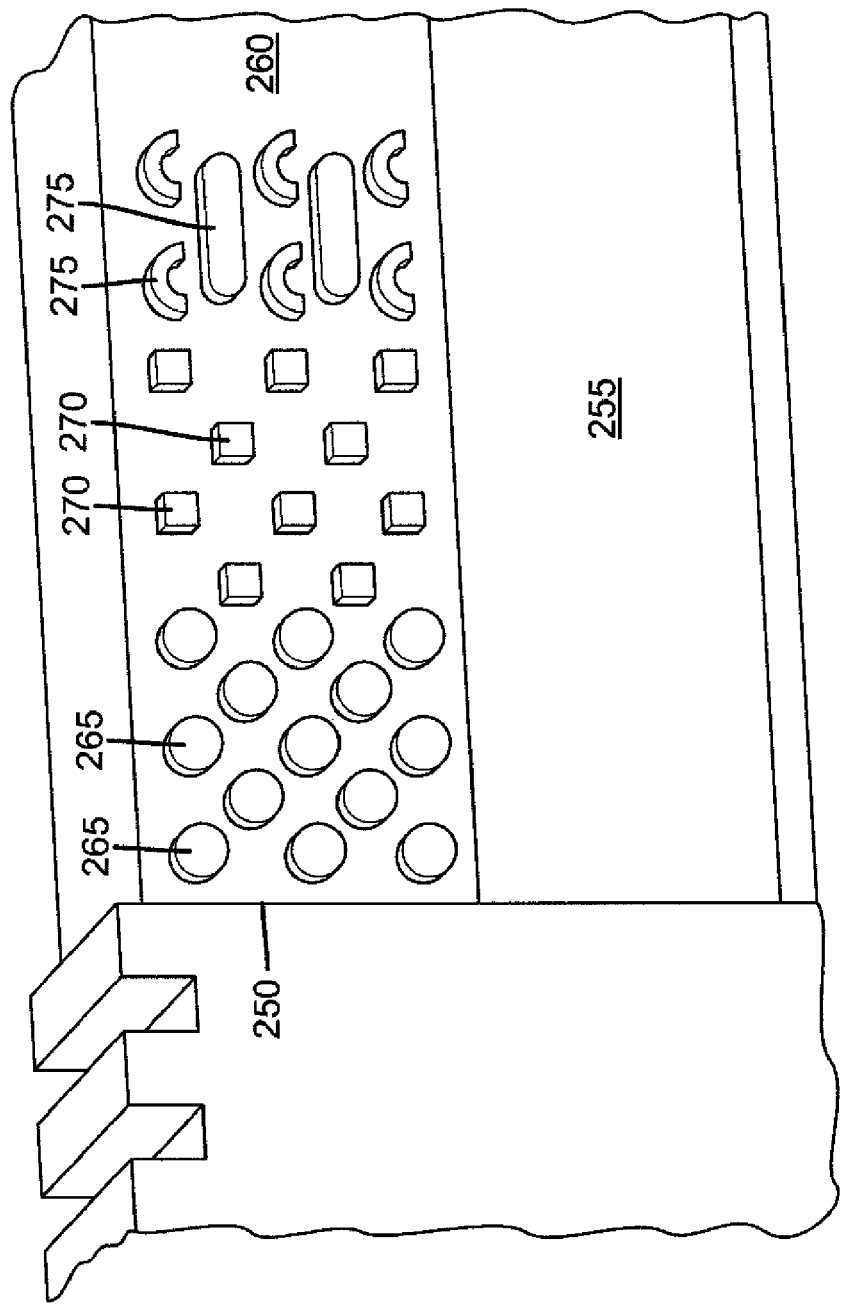
FIG. 2 shows several exemplary diffuser relief patterns and the possibility for a variable relief pattern.

A typical plate structure in a perspective view is shown in FIG. 2, along with axis directions as indicated in the Figure. The surface of the metal plate has a highest area 250 in the z direction. In the case of gas exiting from the diffuser, the gas will arrive in some fashion into a relatively deep recess 255 which allows the gas to flow laterally in the x direction before passing through the diffuser region 260 in the y direction. For purposes of example, several different patterns are shown in the diffuser region 260, including cylindrical posts 265, square posts 270, and arbitrary shapes 275. The height of the features 265, 270, or 275 in the z direction should typically be such that their top surface is at the same as that of a relatively flat area of plate surface 250, such that when a flat plate is superimposed on the plate of FIG. 2 contact is made on the top of the post structures forcing the gas to travel only in the regions left between the post structures. The patterns 265, 270, and 275 are exemplary and any suitable pattern that provides the required backpressure can be chosen.

FIG. 2 shows several different diffuser patterns on a single plate structure. It may be desirable to have several different structures on a single diffuser channel to produce specific gas exit patterns. Alternatively, it may be desirable to have only a single pattern if that produces the desired uniform flow. Furthermore, a single pattern may be used in which the size or the density of the features varies depending upon position in the diffuser assembly.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

For the description that follows, superposition has its conventional meaning, wherein elements are laid atop or against one another in such manner that parts of one element align with corresponding parts of another and that their perimeters generally coincide.

Terms "upstream" and "downstream" have their conventional meanings as relates to the direction of gas flow.

The present invention is particularly applicable to a form of ALD, employing an improved distribution device for delivery of gaseous materials to a substrate surface, adaptable to deposition on larger and web-based substrates and capable of achieving a highly uniform thin-film deposition at improved throughput speeds. The apparatus and method of the present invention employs a continuous (as opposed to pulsed) gaseous material distribution. The apparatus of the present invention allows operation at atmospheric or near-atmospheric pressures as well as under vacuum and is capable of operating in an unsealed or open-air environment.

Figure 3:
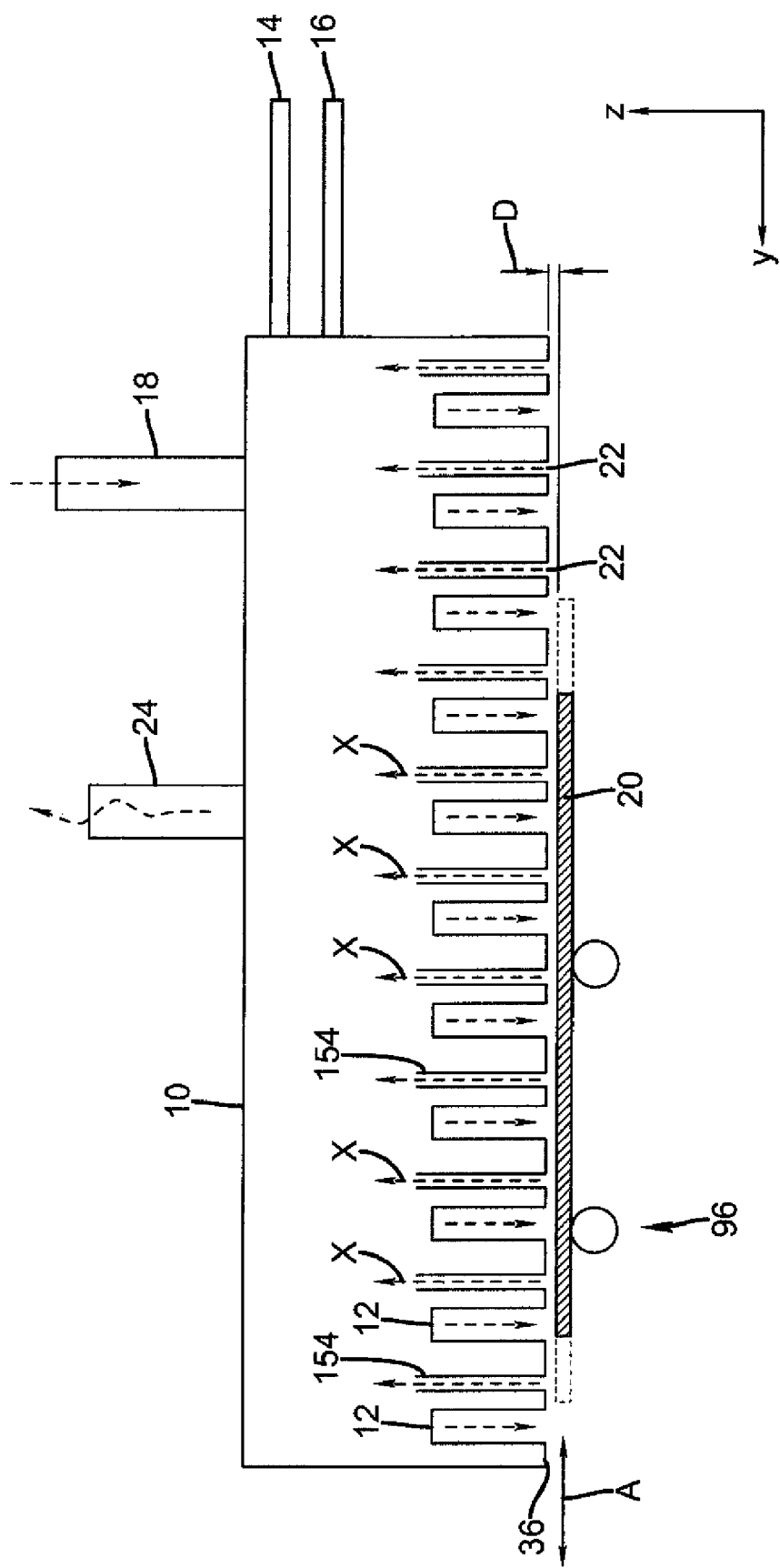
FIG. 3 is a cross-sectional side view of one embodiment of a delivery device for atomic layer deposition according to the present invention.

Referring to FIG. 3, there is shown a cross-sectional side view of one embodiment of a delivery head 10 for atomic layer deposition onto a substrate 20 according to the present invention. Delivery head 10 has a gas inlet port connected to conduit 14 for accepting a first gaseous material, a gas inlet port connected to conduit 16 for accepting a second gaseous material, and a gas inlet port connected to conduit 18 for accepting a third gaseous material. These gases are emitted at an output face 36 via output channels 12, having a structural arrangement described subsequently. The dashed line arrows in FIG. 3 and subsequent FIGS. 4-5B refer to the delivery of gases to substrate 20 from delivery head 10. In FIG. 3, dotted line arrows X also indicate paths for gas exhaust (shown directed upwards in this figure) and exhaust channels 22, in communication with an exhaust port connected to conduit 24. For simplicity of description, gas exhaust is not indicated in FIGS. 4-5B. Because the exhaust gases still may contain quantities of unreacted precursors, it may be undesirable to allow an exhaust flow predominantly containing one reactive species to mix with one predominantly containing another species. As such, it is recognized that the delivery head 10 may contain several independent exhaust ports.

In one embodiment, gas inlet conduits 14 and 16 are adapted to accept first and second gases that react sequentially on the substrate surface to effect ALD deposition, and gas inlet conduit 18 receives a purge gas that is inert with respect to the first and second gases. Delivery head 10 is spaced a distance D from substrate 20, which may be provided on a substrate support, as described in more detail subsequently. Reciprocating motion can be provided between substrate 20 and delivery head 10, either by movement of substrate 20, by movement of delivery head 10, or by movement of both substrate 20 and delivery head 10. In the particular embodiment shown in FIG. 3, substrate 20 is moved by a substrate support 96 across output face 36 in reciprocating fashion, as indicated by the arrow A and by phantom outlines to the right and left of substrate 20 in FIG. 3. It should be noted that reciprocating motion is not always required for thin-film deposition using delivery head 10. Other types of relative motion between substrate 20 and delivery head 10 could also be provided, such as movement of either substrate 20 or delivery head 10 in one or more directions, as described in more detail subsequently.

Figure 4:
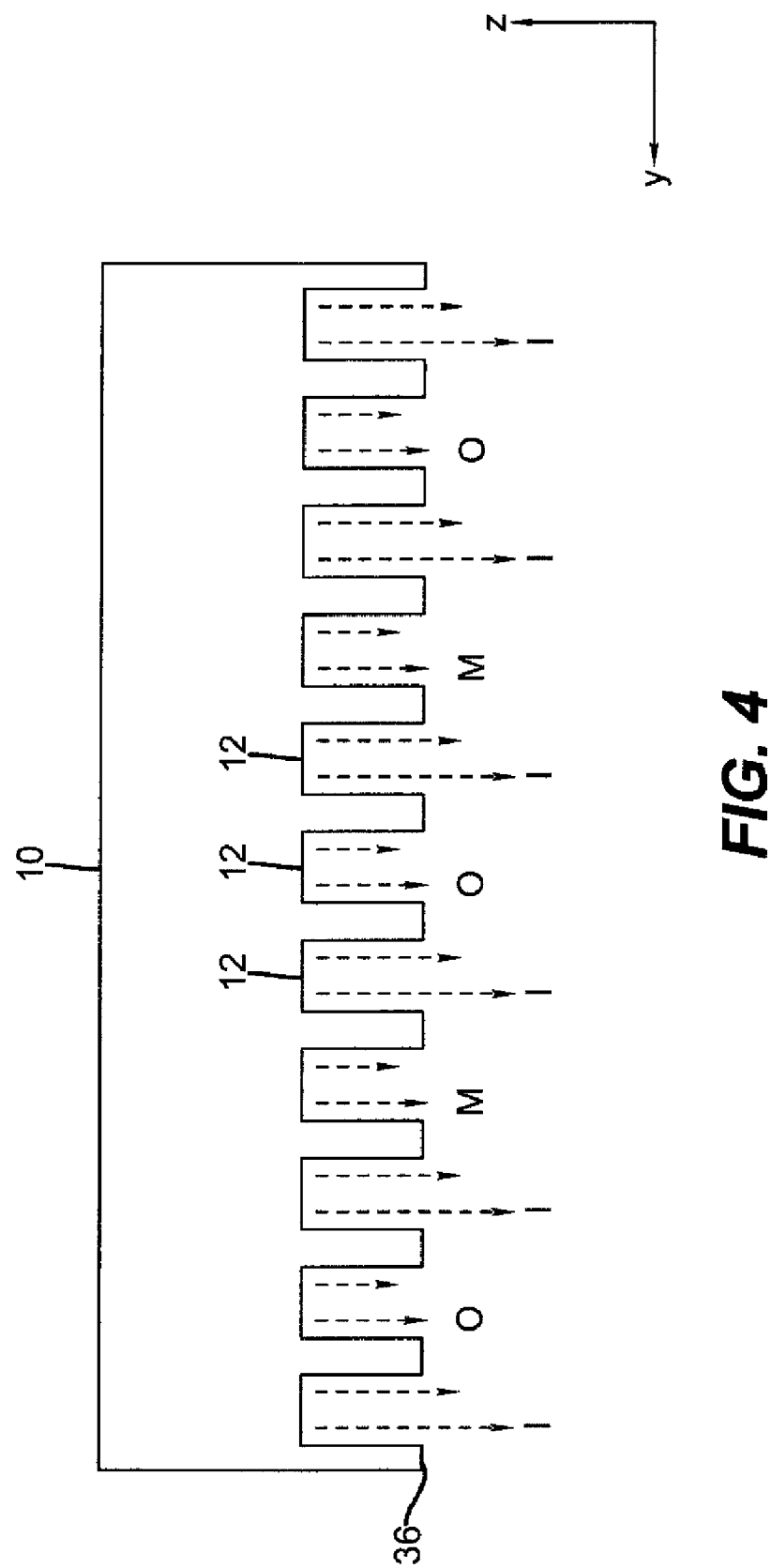
FIG. 4 is a cross-sectional side view of one embodiment of a delivery device showing one exemplary arrangement of gaseous materials provided to a substrate that is subject to thin film deposition.

The cross-sectional view of FIG. 4 shows gas flows emitted over a portion of output face 36 of delivery head 10 (with the exhaust path omitted as noted earlier). In this particular arrangement, each output channel 12 is in gaseous flow communication with one of gas inlet conduits 14, 16 or 18 as shown in FIG. 3. Each output channel 12 delivers typically a first reactant gaseous material O, or a second reactant gaseous material M, or a third inert gaseous material I.

FIG. 4 shows a relatively basic or simple arrangement of gases. It is envisioned that a plurality of flows of a non-metal deposition precursor (like material O) or a plurality of flows of a metal-containing precursor material (like material M) may be delivered sequentially at various ports in a thin-film single deposition. Alternately, a mixture of reactant gases, for example, a mixture of metal precursor materials or a mixture of metal and non-metal precursors may be applied at a single output channel when making complex thin film materials, for example, having alternate layers of metals or having lesser amounts of dopants admixed in a metal oxide material. Significantly, an inter-stream labeled I for an inert gas, also termed a purge gas, separates any reactant channels in which the gases are likely to react with each other. First and second reactant gaseous materials O and M react with each other to effect ALD deposition, but neither reactant gaseous material O nor M reacts with inert gaseous material I. The nomenclature used in FIG. 4 and following suggests some typical types of reactant gases. For example, first reactant gaseous material O could be an oxidizing gaseous material; second reactant gaseous material M could be a metal-containing compound, such as a material containing zinc. Inert gaseous material I could be nitrogen, argon, helium, or other gases commonly used as purge gases in ALD systems. Inert gaseous material I is inert with respect to first or second reactant gaseous materials O and M. Reaction between first and second reactant gaseous materials would form a metal oxide or other binary compound, such as zinc oxide ZnO or ZnS, used in semiconductors, in one embodiment. Reactions between more than two reactant gaseous materials could form a ternary compound, for example, ZnAlO.

The cross-sectional views of FIGS. 5A and 5B show, in simplified schematic form, the ALD coating operation performed as substrate 20 passes along output face 36 of delivery head 10 when delivering reactant gaseous materials O and M. In FIG. 5A, the surface of substrate 20 first receives an oxidizing material continuously emitted from output channels 12 designated as delivering first reactant gaseous material O. The surface of the substrate now contains a partially reacted form of material O, which is susceptible to reaction with material M. Then, as substrate 20 passes into the path of the metal compound of second reactant gaseous material M, the reaction with M takes place, forming a metallic oxide or some other thin film material that can be formed from two reactant gaseous materials. Unlike conventional solutions, the deposition sequence shown in FIGS. 5A and 5B is continuous during deposition for a given substrate or specified area thereof, rather than pulsed. That is, materials O and M are continuously emitted as substrate 20 passes across the surface of delivery head 10 or, conversely, as delivery head 10 passes along the surface of substrate 20.

As FIGS. 5A and 5B show, inert gaseous material I is provided in alternate output channels 12, between the flows of first and second reactant gaseous materials O and M. Notably, as was shown in FIG. 3, there are exhaust channels 22. Only exhaust channels 22, providing a small amount of draw, are needed to vent spent gases emitted from delivery head 10 and used in processing.

In one embodiment, as described in more detail in copending, commonly assigned U.S. patent application Ser. No. 11/620,744, mentioned above, gas pressure is provided against substrate 20, such that separation distance D is maintained, at least in part, by the force of pressure that is exerted. By maintaining some amount of gas pressure between output face 36 and the surface of substrate 20, the apparatus of the present invention can provide at least some portion of an air bearing, or more properly a gas fluid bearing, for delivery head 10 itself or, alternately, for substrate 20. This arrangement helps to simplify the transport requirements for delivery head 10, as described subsequently. The effect of allowing the delivery device to approach the substrate such that it is supported by gas pressure helps to provide isolation between the gas streams. By allowing the head to float on these streams, pressure fields are set up in the reactive and purge flow areas that cause the gases to be directed from inlet to exhaust with little or no intermixing of other gas streams. In one such embodiment, since the separation distance D is relatively small, even a small change in distance D (for example, even 100 micrometers) would require a significant change in flow rates and consequently gas pressure providing the separation distance D. For example, in one embodiment, doubling the separation distance D, involving a change less than 1 mm, would necessitate more than doubling, preferably more than quadrupling, the flow rate of the gases providing the separation distance D.

The present invention does not require a floating head system, however, and the delivery device and the substrate can be at a fixed distance D as in conventional systems. For example, the delivery device and the substrate can be mechanically fixed at separation distance from each other in which the head is not vertically mobile in relationship to the substrate in response to changes in flow rates and in which the substrate is on a vertically fixed substrate support.

In one embodiment of the invention, the delivery device has an output face for providing gaseous materials for thin-film material deposition onto a substrate and comprises:

(a) a plurality of inlet ports comprising at least a first, a second, and a third inlet port capable of receiving a common supply for a first, a second and a third gaseous material, respectively; and (b) a first plurality of elongated emissive channels, a second plurality of elongated emissive channels and a third plurality of elongated emissive channels, each of the first, second, and third elongated emissive channels allowing gaseous fluid communication with one of corresponding first, second, and third inlet ports;

wherein each of the first, second, and third plurality of elongated emissive channels extend in a length direction and are substantially in parallel;

wherein each first elongated emissive channel is separated on each elongated side thereof from the nearest second elongated emissive channel by a third elongated emissive channel;

wherein each first elongated emissive channel and each second elongated emissive channel is situated between third elongated emissive channels, wherein each of the elongated emissive channels in at least one plurality of the first, second and third plurality of elongated emissive channels is capable of directing a flow, respectively, of at least one of the first, second, and the third gaseous material substantially orthogonally with respect to the output face of the delivery device, which flow of gaseous material is capable of being provided, either directly or indirectly from each of the elongated emissive channels in the at least one plurality, substantially orthogonally to the surface of the substrate; and wherein the delivery device is formed as a plurality of apertured plates, disposed substantially in parallel with respect to the output face, and superposed to define a network of interconnecting supply chambers and directing channels for routing each of the first, second, and third gaseous materials from its corresponding inlet port to its corresponding plurality of elongated emissive channels.

Figure 6:
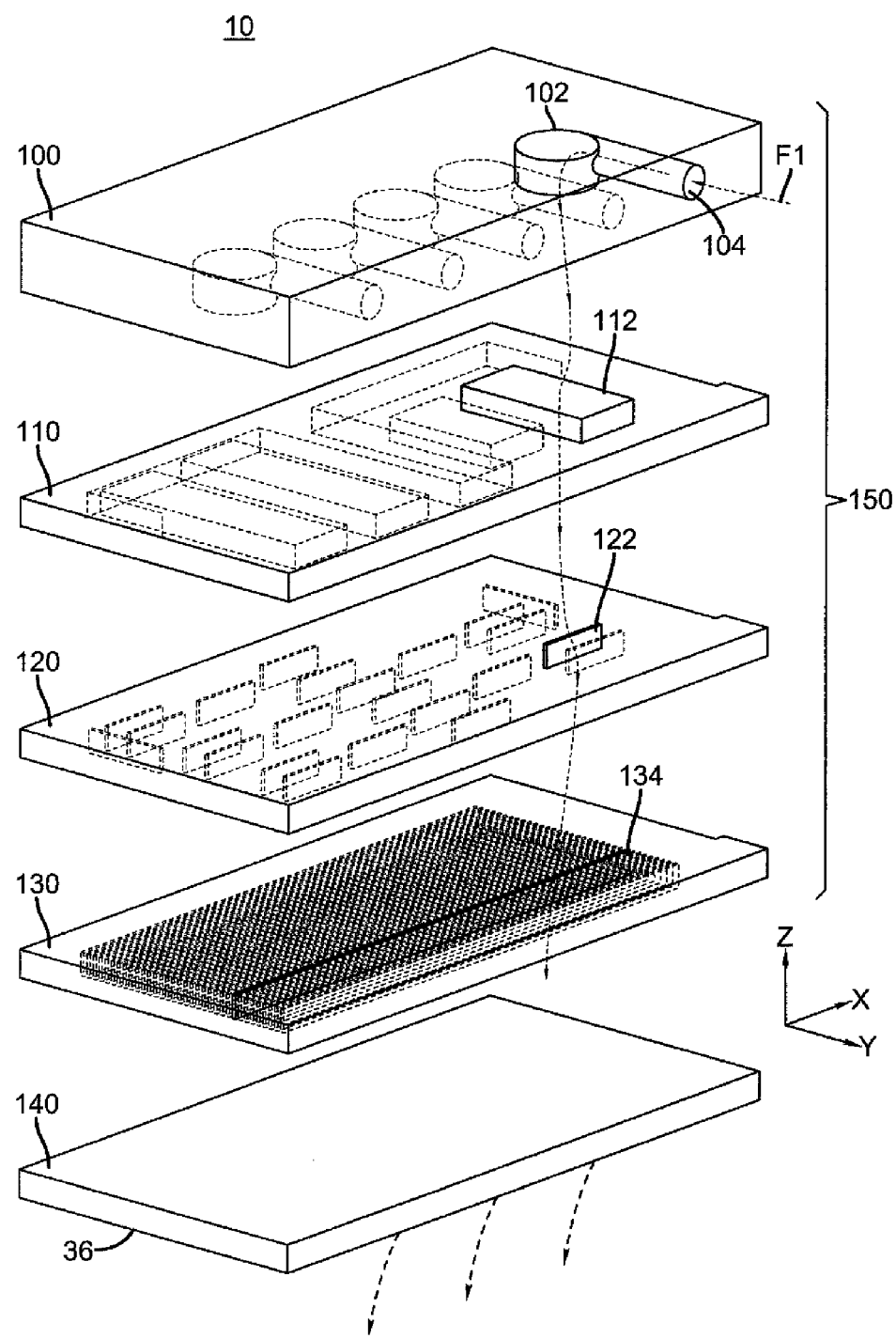
FIG. 6 is a perspective exploded view of a delivery device in a deposition system according to one embodiment, including an optional diffuser unit.

The exploded view of FIG. 6 shows, for a small portion of the overall assembly in one such embodiment, how delivery head 10 can be constructed from a set of apertured plates and shows an exemplary gas flow path for just one portion of one of the gases. A connection plate 100 for the delivery head 10 has a series of input ports 104 for connection to gas supplies that are upstream of delivery head 10 and not shown in FIG. 6. Each input port 104 is in communication with a directing chamber 102 that directs the received gas downstream to a gas chamber plate 110. Gas chamber plate 110 has a supply chamber 112 that is in gas flow communication with an individual directing channel 122 on a gas direction plate 120. From directing channel 122, the gas flow proceeds to a particular elongated exhaust channel 134 on a base plate 130. A gas diffuser unit 140 provides diffusion and final delivery of the input gas at its output face 36. A diffuser system is especially advantageous for a floating head system described above, since it can provide a back pressure within the delivery device that facilitates the floating of the head. An exemplary gas flow F1 is traced through each of the component assemblies of delivery head 10.

As shown in the example of FIG. 6, delivery assembly 150 of delivery head 10 is formed as an arrangement of superposed apertured plates: connection plate 100, gas chamber plate 110, gas direction plate 120, and base plate 130. These plates are disposed substantially in parallel to output face 36 in this "horizontal" embodiment.

Gas diffuser unit 140 of this invention is formed from superposed apertured plates, as is described subsequently. It can be appreciated that any of the plates shown in FIG. 6 could itself be fabricated from a stack of superposed plates. For example, it may be advantageous to form connection plate 100 from four or five stacked apertured plates that are suitably coupled together. This type of arrangement can be less complex than machining or molding methods for forming directing chambers 102 and input ports 104.

Figure 7A:
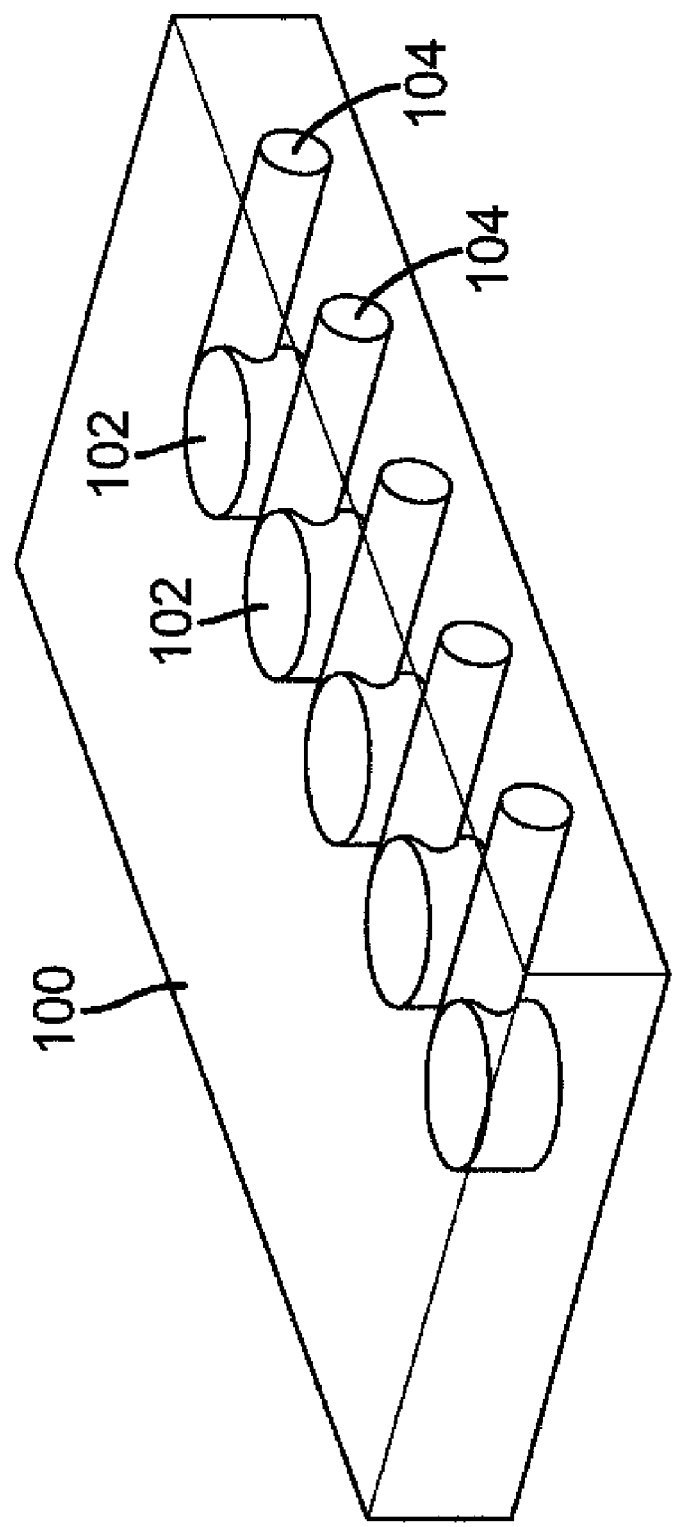
FIG. 7A is a perspective view of a connection plate for the delivery device of FIG. 6.
Figure 7B:
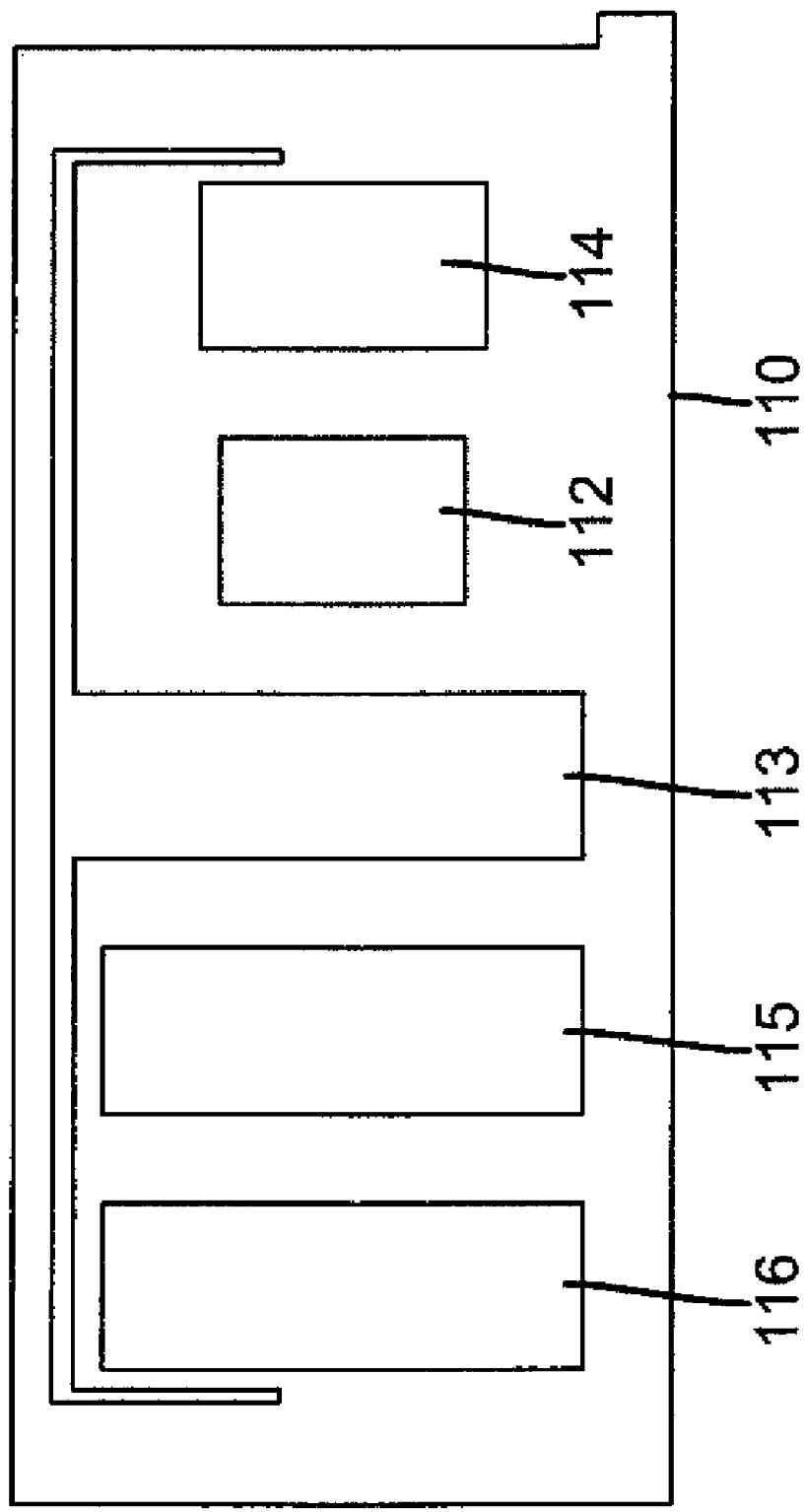
FIG. 7B is a plan view of a gas chamber plate for the delivery device of FIG. 6.

FIGS. 7A through 7D show each of the major components that can be combined together to form delivery head 10 in the embodiment of FIG. 6. FIG. 7A is a perspective view of connection plate 100, showing multiple directing chambers 102 and input ports 104. FIG. 7B is a plan view of gas chamber plate 110. A supply chamber 113 is used for purge or inert gas (involving mixing on a molecular basis between the same molecular species during steady state operation) for delivery head 10 in one embodiment. A supply chamber 115 provides mixing for a precursor gas (O) in one embodiment; an exhaust chamber 116 provides an exhaust path for this reactive gas. Similarly, a supply chamber 112 provides the other needed reactive gas, second reactant gaseous material (M); an exhaust chamber 114 provides an exhaust path for this gas.

Figure 7C:
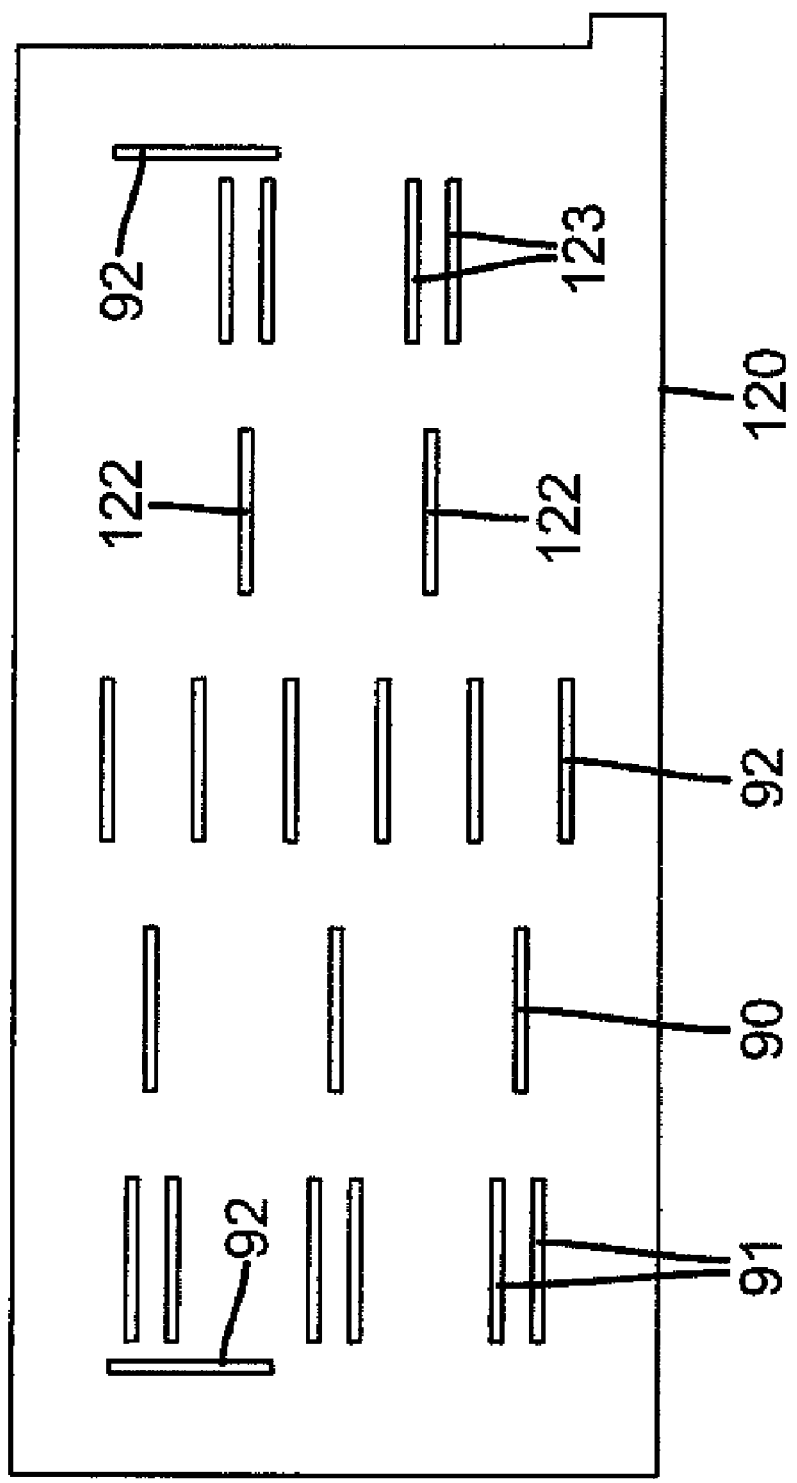
FIG. 7C is a plan view of a gas direction plate for the delivery device of FIG. 6.
Figure 7D:
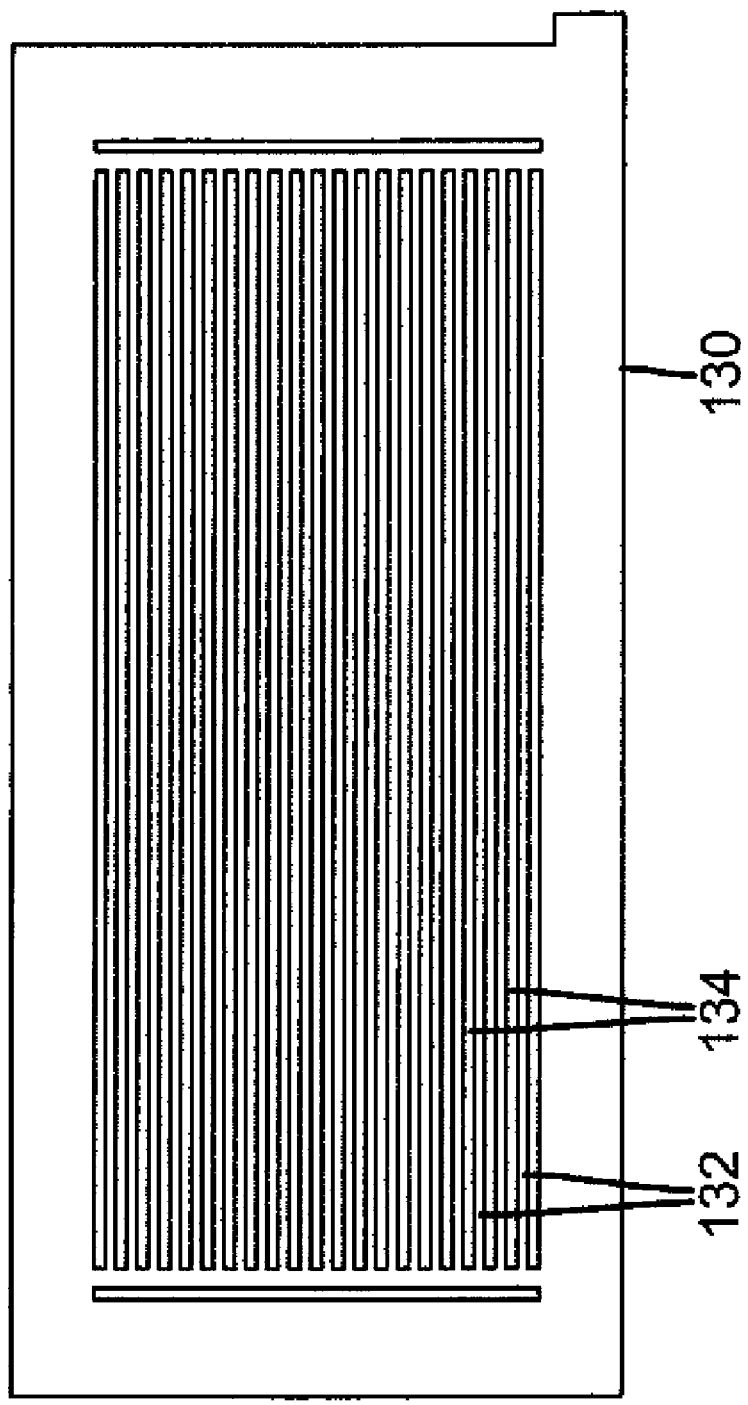
FIG. 7D is a plan view of a base plate for the delivery device of FIG. 6.

FIG. 7C is a plan view of gas direction plate 120 for delivery head 10 in this embodiment. Multiple directing channels 122, providing a second reactant gaseous material (M), are arranged in a pattern for connecting the appropriate supply chamber 112 (not shown in this view) with base plate 130. Corresponding exhaust directing channels 123 are positioned near directing channels 122. Directing channels 90 provide the first reactant gaseous material (O). Directing channels 92 provide purge gas (I). Again, it must be emphasized that FIGS. 6 and 7A-7D show one illustrative embodiment; numerous other embodiments are also possible.

Figure 8:
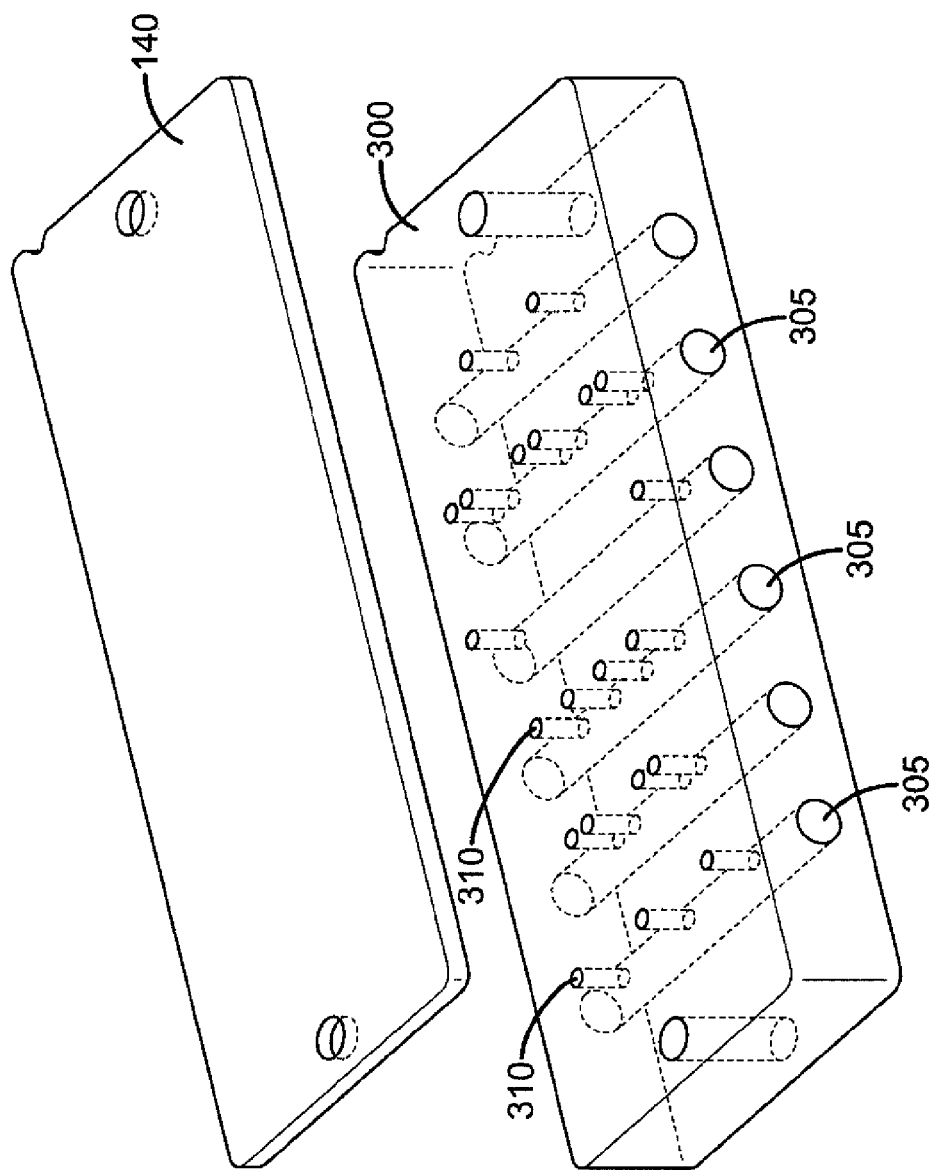
FIG. 8 is a perspective view of the supply portions of one embodiment of a delivery device machined from a single piece of material, onto which a diffuser element of this invention could be directly attached.
Figure 9:
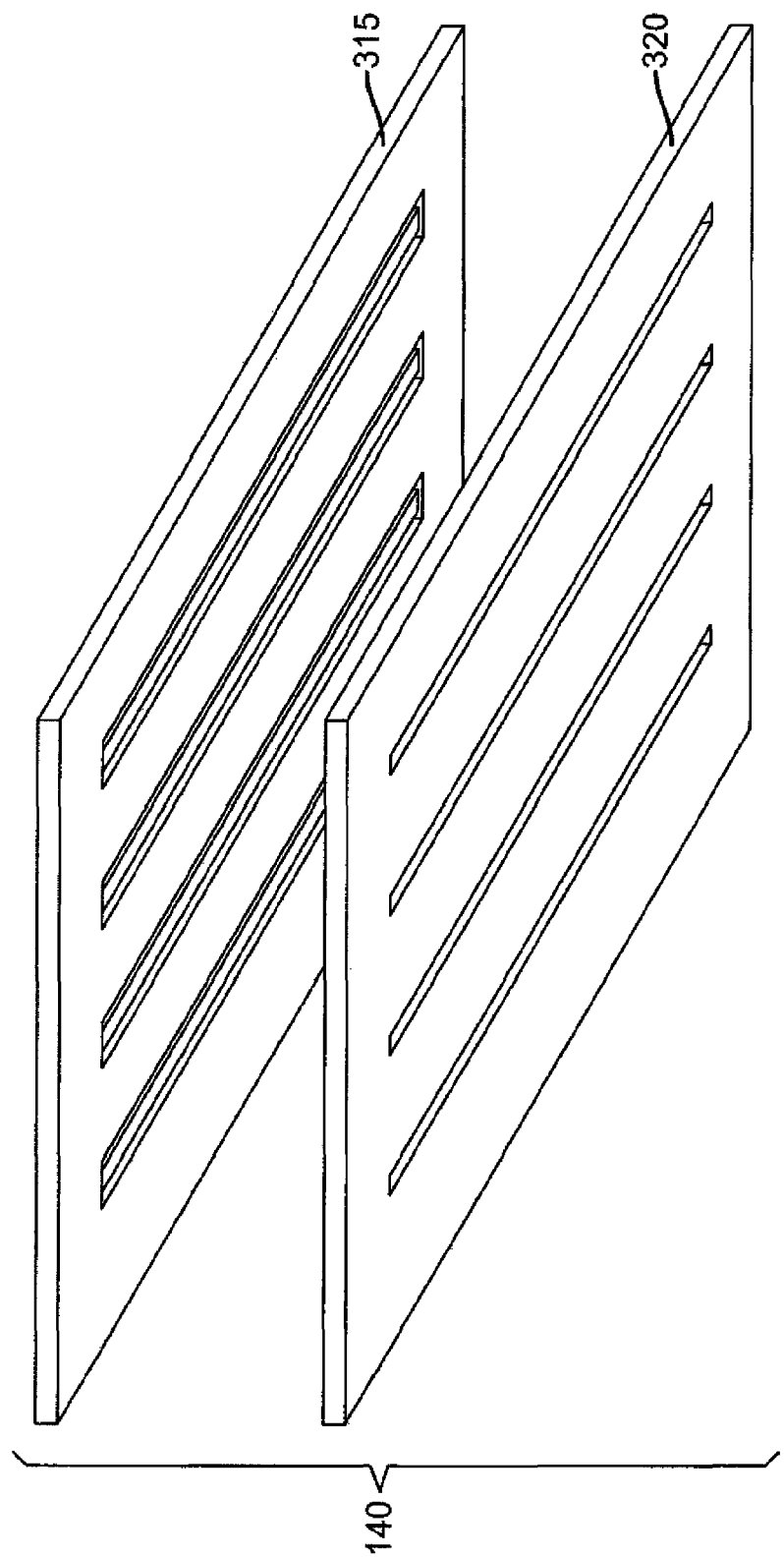
FIG. 9 is a perspective view showing a two plate diffuser assembly for a delivery device in one embodiment.
Figure 10B:
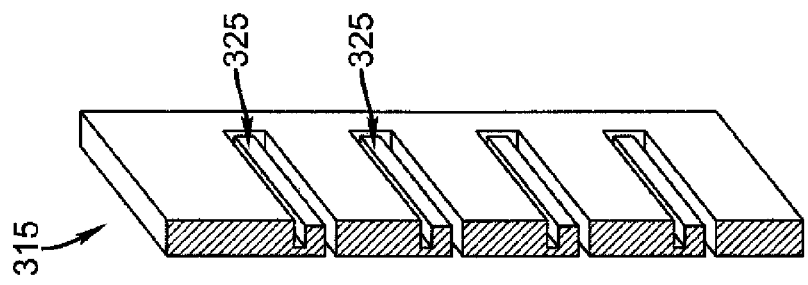
FIGS. 10A and 10B show a plan view and a perspective cross-section view of one of the two plates in one embodiment of a horizontal plate diffuser assembly.
Figure 10A:
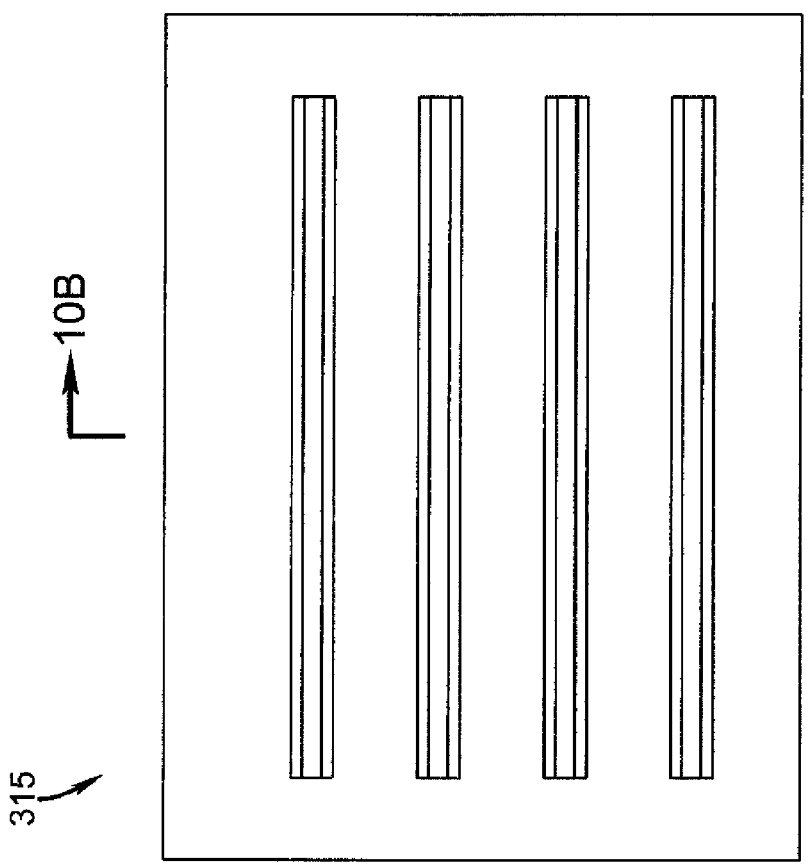
Figure 11B:
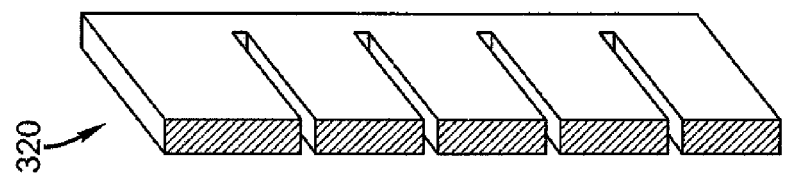
FIGS. 11A and 11B show the plan view and a perspective cross-section view of the other plate with respect to FIG. 9 in a horizontal plate diffuser assembly.
Figure 11A:
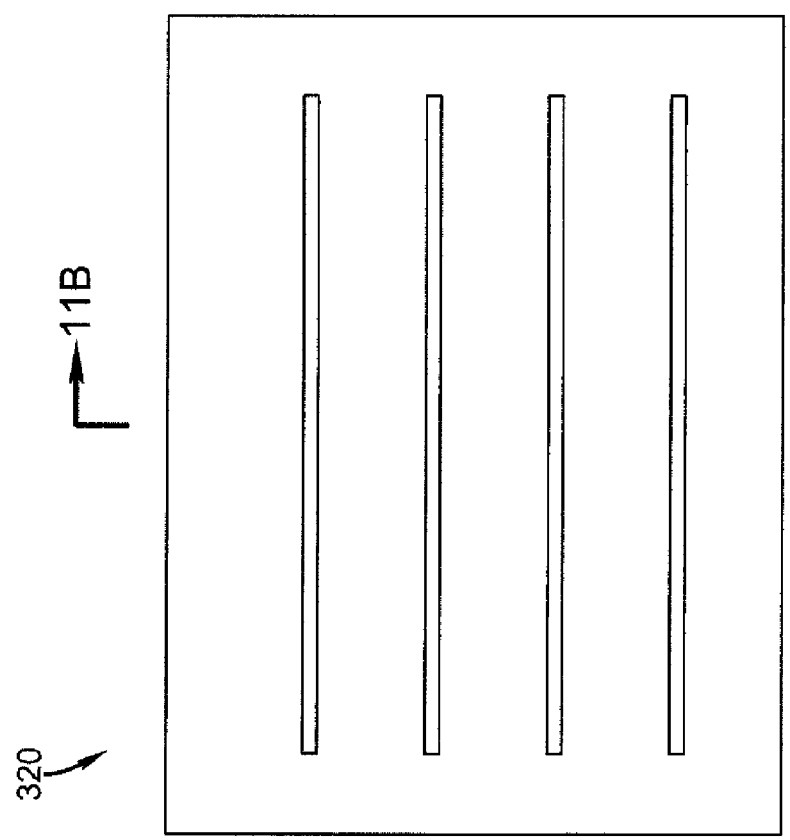

The elements of the delivery head of the embodiment of FIG. 6 are composed of several overlying plates in order to achieve the necessary gas flow paths to deliver gases in the correct locations to the diffusers of this invention. This method is useful because very complicated internal pathways can be produced by a simple superposition of apertured plates. Alternatively, it is possible with current machining or rapid prototyping methods to machine a single block of materials to contain adequate internal pathways to interface with the diffusers of this invention. For example, FIG. 8 shows an embodiment of a single machined block 300. In this block, supply lines 305 are formed by boring channels through the block. These lines can exit on both ends as shown or be capped or sealed on one end. In operation, these channels can be fed by both ends or serve as feed troughs to subsequent blocks mounted in a total system. From these supply lines, small channels 310 extend to the diffuser plate assembly 140 in order to feed the various channels leading the elongated output face openings.

FIGS. 9 through 12B detail the construction of a horizontally disposed gas diffuser plate assembly 140 of the current invention. The diffuser plate assembly 140 is preferably composed of two plates 315 and 320 as shown in perspective exploded view in FIG. 9. The top plate of this assembly 315 is shown in more detail in FIGS. 10A (plan view) and 10B (perspective view). The perspective view is taken as a cross-section on the dotted line 10B-10B. The area of the diffuser pattern 325 is shown. The bottom plate of this assembly 320 is shown in more detail in FIGS. 11A (plan view) and 11B (perspective view). The perspective view is taken as a cross-section on the dotted line 11B-11B.

Figure 12B:
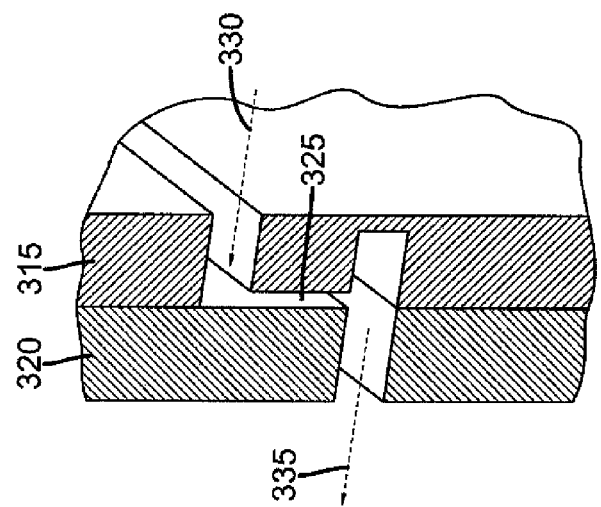
FIGS. 12A and 12B show a cross-section view and a magnified cross-sectional view respectively of an assembled two plate diffuser assembly.
Figure 12A:
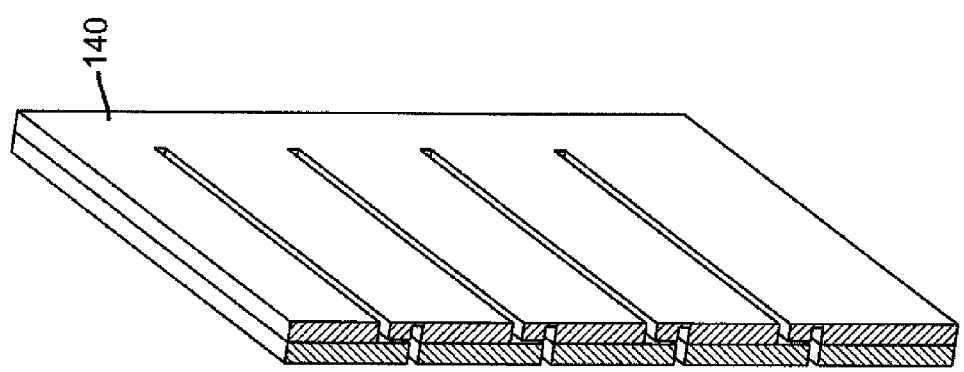

The combined operation of these plates in shown in FIGS. 12A and 12B which show the assembled structure, and a magnification of one of the channels, respectively. In the assembled plate structure, gas supply 330 enters the plate, and is forced to flow through the diffuser region 325 which is now composed of fine channels due to the assembly of plate 315 with plate 320. After passing through the diffuser, diffused gas 335 exits to the output face.

Referring back to FIG. 6, the combination of components shown as connection plate 100, gas chamber plate 110, gas direction plate 120, and base plate 130 can be grouped to provide a delivery assembly 150. Alternate embodiments are possible for delivery assembly 150, including one formed from vertical, rather than horizontal, apertured plates using the coordinate arrangement of FIG. 6.

Figure 13:
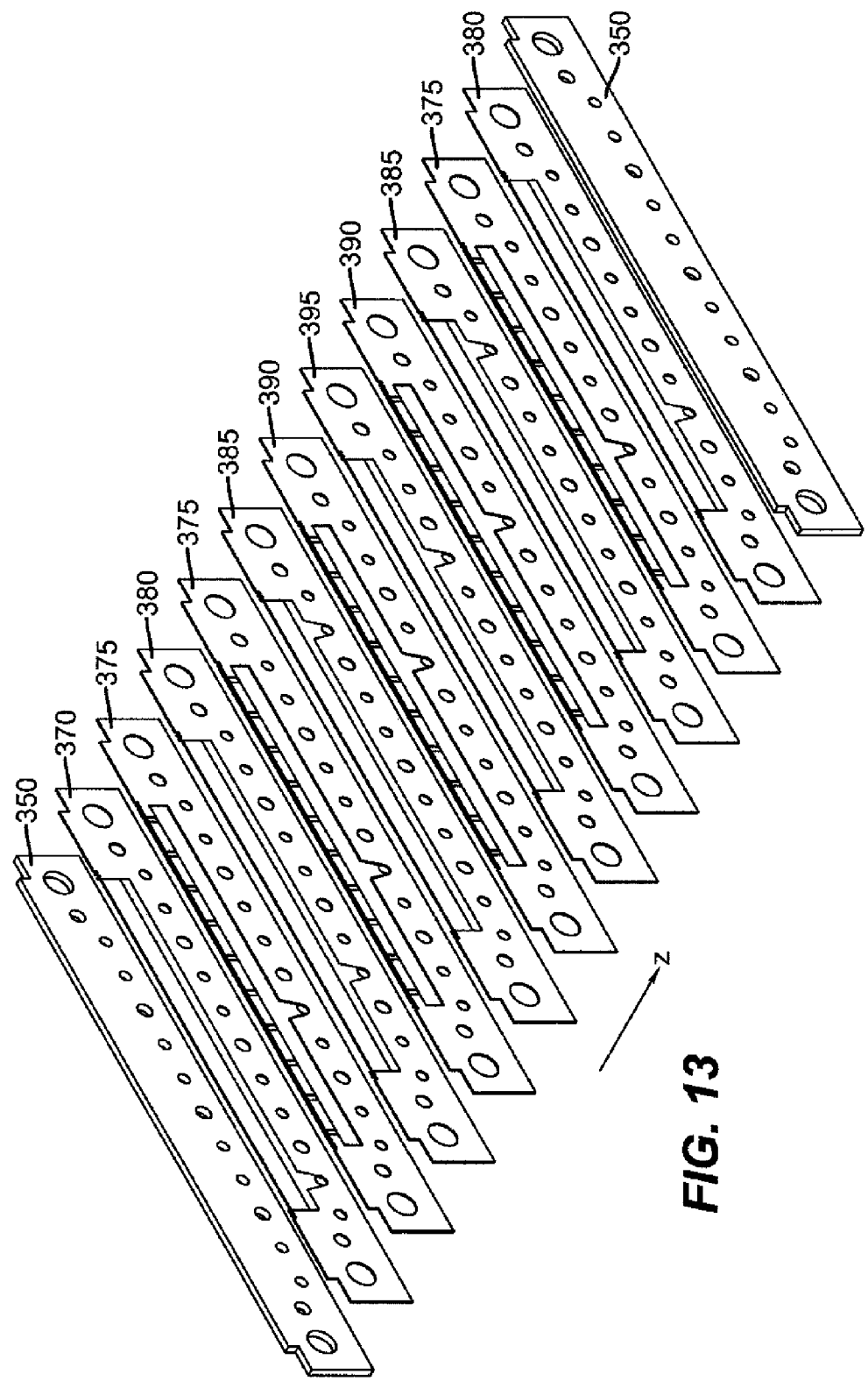
FIG. 13 is a perspective exploded view of a delivery device in a deposition system according to one embodiment employing plates perpendicular to the resulting output face.

Referring to FIG. 13, there is shown such an alternative embodiment, from a bottom view (that is, viewed from the gas emission side). Such an alternate arrangement can be used for a delivery assembly using a stack of superposed apertured plates that are disposed perpendicularly with respect to the output face of the delivery head.

Figure 14:
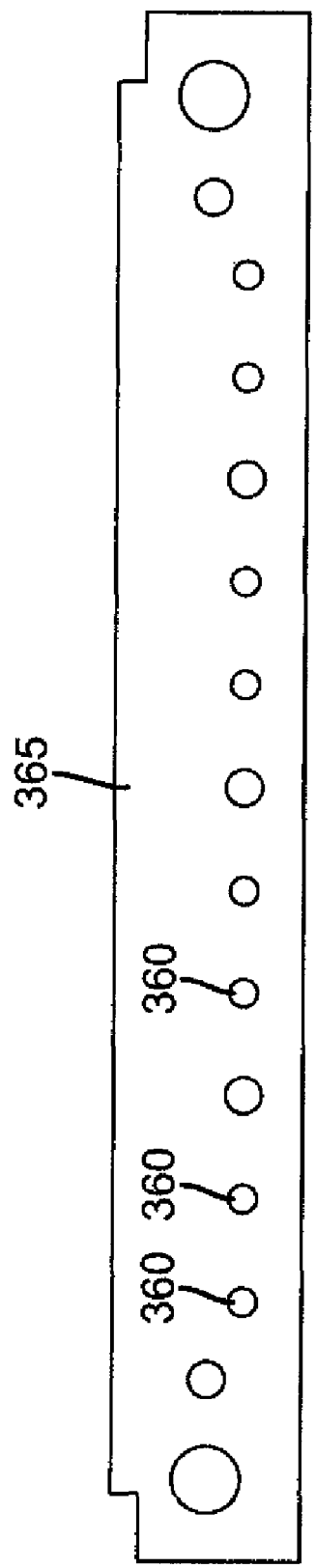
FIG. 14 shows a plan view of a spacer plate containing no relief patterns for use in a perpendicular plate orientation design.

A typical plate outline 365 without a diffuser region is shown in FIG. 14. Supply holes 360 form the supply channels when a series of plates are superposed.

Referring back to FIG. 13, two optional end plates 350 sit at the ends of this structure. The particular elements of this exemplary structure are:

Plate 370: Connecting supply line #2 to output face via a diffuser;
Plate 375: Connecting supply line #5 to output face via a diffuser;
Plate 380: Connecting supply line #4 to output face via a diffuser;
Plate 385: Connecting supply line #10 to output face via a diffuser;
Plate 390: Connecting supply line #7 to output face via a diffuser; and
Plate 395: Connecting supply line #8 to output face via a diffuser.

It can be appreciated that by varying the type of plate and its order in the sequence, any combination and order of input channels to output face locations can be achieved.

In the particular embodiment of FIG. 13, the plates have patterns etched only in a single side and the back side (not seen) is smooth except for holes needed for supply lines and assembly or fastening needs (screw holes, alignment holes). Considering any two plates in the sequence, the back of the next plate in the z direction serves as both the flat seal plate against the prior plate and, on its side facing forward in the z direction, as the channels and diffusers for the next elongated opening in the output face.

Alternatively, it is possible to have plates with patterns etched on both sides, and then to use flat spacer plates between them in order to provide the sealing mechanisms FIGS. 15A-15C show detailed views of a typical plate used in a vertical plate assembly, in this case a plate that connects the $8^{th}$ supply hole to the output face diffuser area. FIG. 15A shows a plan view, FIG. 15B shows a perspective view, and FIG. 15C shows a perspective section view sectioned at dotted line 15C-15C of FIG. 15B.

In FIG. 15C, a magnification of the plate shows the delivery channel 405 that takes gas from the designated supply line 360 and feeds it to the diffuser area 410 which has a relief pattern (not shown) as described, for example, in earlier FIG. 2.

An alternate type of plate with diffuser channel is shown in FIGS. 16A-16C. In this embodiment, the plate connects the $5^{th}$ supply channel to the output area through a discrete diffuser pattern composed of mainly raised areas 420 with discrete recesses 430, forming a relief pattern, through which gas can pass in an assembled structure. In this case, the raised areas 420 block the flow when the plate is assembled facing another flat plate and the gas must flow in through the discrete recesses, the recesses being patterned in such a way that the individual entrance areas of the diffusing channel do not interconnect. In other embodiments, a substantially continuous network of flow paths are formed in the diffusing channel 260 as shown in FIG. 2, in which posts or other projections or micro-blocking areas separate the microchannels that allow flow of gaseous material.

The ALD deposition apparatus application for this diffuser invention requires adjacent elongated openings on the output face, some of which supply gas to the output face while others withdraw gas. The diffusers of this invention can always work in both directions, the difference being whether the gas is forced to the output face or pulled from there.

The output of the diffuser channel can be in line of sight contact with the plane of the output face. Alternatively, there may be a need to further diffuse the gas exiting from the diffuser created by the contact of a sealing plate to a plate with a relief pattern. FIGS. 17A and 17B show such a design where a relief-pattern-containing plate 450 is in contact with a sealing plate 455 that has an extra feature 460 that causes gas exiting the diffuser areas 465 to deflect prior to reaching the output face 36.

Returning to FIG. 13, the assembly 350 shows an arbitrary order of plates. For simplicity, letter designations can be given to each type of apertured plate: Purge P, Reactant R, and Exhaust E. A minimal delivery assembly 350 for providing two reactive gases along with the necessary purge gases and exhaust channels for typical ALD deposition would be represented using the full abbreviation sequence:

P-E1-R1-E1-P-E2-R2-E2-P-E1-R1-E1-P-E2-R2-E2-P-E1-R1-E1-P where R1 and R2 represent reactant plates in different orientations, for the two different reactant gases used, and E1 and E2 correspondingly represent exhaust plates in different orientations.

Now referring back to FIG. 3, an elongated exhaust channel 154 need not be a vacuum port, in the conventional sense, but may simply be provided to draw off the flow from its corresponding output channel 12, thus facilitating a uniform flow pattern within the channel. A negative draw, just slightly less than the opposite of the gas pressure at neighboring elongated emissive channels, can help to facilitate an orderly flow. The negative draw can, for example, operate with draw pressure at the source (for example, a vacuum pump) of between 0.2 and 1.0 atmosphere, whereas a typical vacuum is, for example, below 0.1 atmosphere.

Use of the flow pattern provided by delivery head 10 provides a number of advantages over conventional approaches, such as those noted earlier in the background section, that pulse gases individually to a deposition chamber. Mobility of the deposition apparatus improves, and the device of the present invention is suited to high-volume deposition applications in which the substrate dimensions exceed the size of the deposition head. Flow dynamics are also improved over earlier approaches.

The flow arrangement used in the present invention allows a very small distance D between delivery head 10 and substrate 20, as was shown in FIG. 3, preferably under 1 mm. Output face 36 can be positioned very closely, to within about 1 mil (approximately 0.025 mm) of the substrate surface. By comparison, earlier approaches such as that described in the U.S. Pat. No. 6,821,563 to Yudovsky, cited earlier, were limited to 0.5 mm or greater distance to the substrate surface, whereas embodiments of the present invention can be practice at less than 0.5 mm, for example, less than 0.450 mm. In fact, positioning the delivery head 10 closer to the substrate surface is preferred in the present invention. In a particularly preferred embodiment, distance D from the surface of the substrate can be 0.20 mm or less, preferably less than 100 μm.

In one embodiment, the delivery head 10 of the present invention can be maintained a suitable separation distance D (FIG. 3) between its output face 36 and the surface of substrate 20, by using a floating system.

The pressure of emitted gas from one or more of output channels 12 generates a force. In order for this force to provide a useful cushioning or "air" bearing (gas fluid bearing) effect for delivery head 10, there must be sufficient landing area, that is, solid surface area along output face 36 that can be brought into close contact with the substrate. The percentage of landing area corresponds to the relative amount of solid area of output face 36 that allows build-up of gas pressure beneath it. In simplest terms, the landing area can be computed as the total area of output face 36 minus the total surface area of output channels 12 and exhaust channels 22. This means that total surface area, excluding the gas flow areas of output channels 12, having a width w1, or of exhaust channels 22, having a width w2, must be maximized as much as possible. A landing area of 95% is provided in one embodiment. Other embodiments may use smaller landing area values, such as 85% or 75%, for example. Adjustment of gas flow rate could also be used in order to alter the separation or cushioning force and thus change distance D accordingly.

It can be appreciated that there would be advantages to providing a gas fluid bearing, so that delivery head 10 is substantially maintained at a distance D above substrate 20. This would allow essentially frictionless motion of delivery head 10 using any suitable type of transport mechanism. Delivery head 10 could then be caused to "hover" above the surface of substrate 20 as it is channeled back and forth, sweeping across the surface of substrate 20 during materials deposition.

Figure 18:
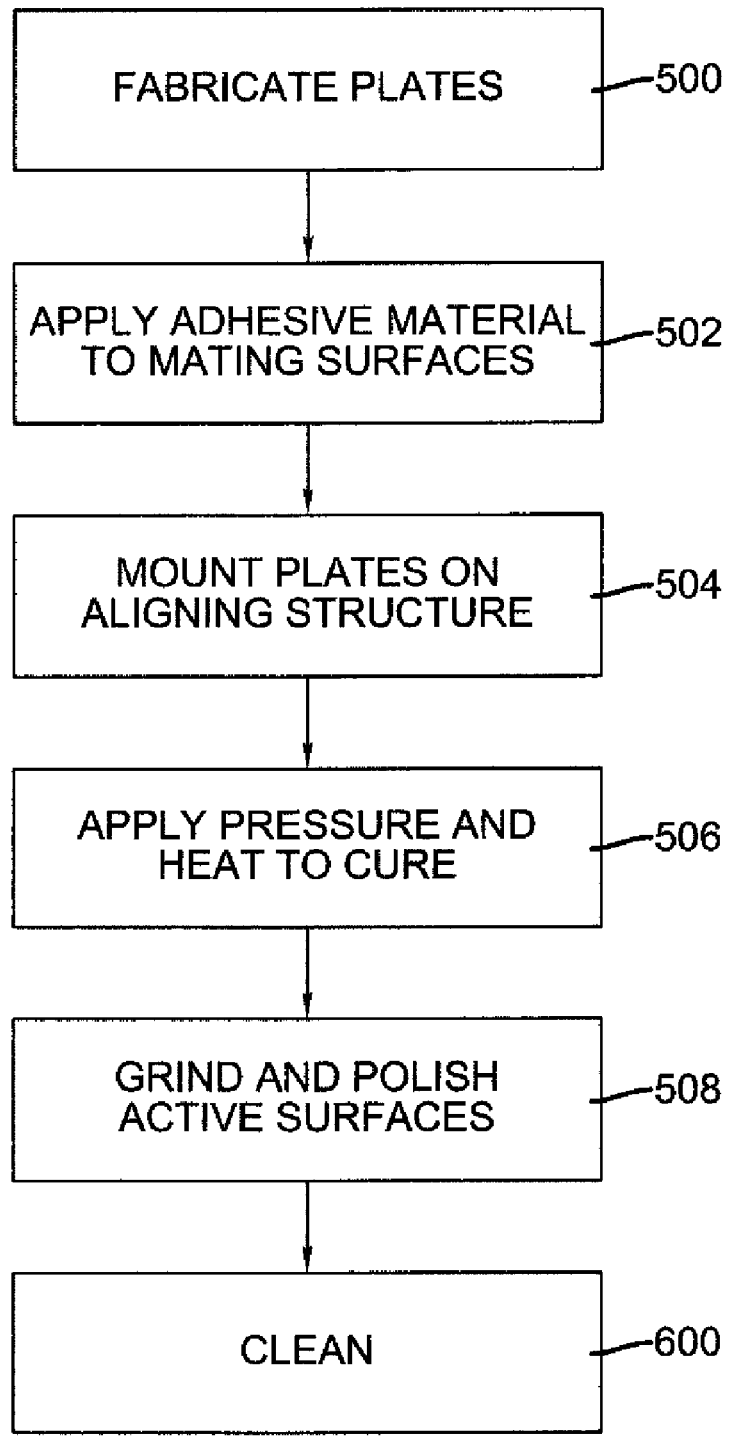
FIG. 18 shows a flow diagram for a method of assembling the delivery devices of this invention.

The deposition heads of a preferred embodiment comprise of a series of plates assembled in a process, whether horizontally disposed, vertically disposed, or a combination thereof, one example of a process of assembly is shown in FIG. 18.

Basically, the process of assembling a delivery head for thin-film material deposition onto a substrate comprises: (a) fabricating a series of plates (step 500 of FIG. 18) at least a portion thereof containing relief patterns for forming a diffuser element; and (b) attaching the plates to each other in sequence so as to form a network of supply lines connected to one or more diffuser elements. Such a process optionally involves placing a spacer plate containing no relief pattern which is placed between at least one pair of plates each containing a relief pattern.

In one embodiment, the order of assembly produces a plurality of flow paths in which each of the plurality of elongated output openings of the first gaseous material in the output face is separated from at least one of the plurality of elongated output openings of the second gaseous material in the output face by at least one of the plurality of elongated output openings of the third gaseous material in the output face. In another embodiment, the order of assembly produces a plurality of flow paths in which each of the plurality of elongated output openings of the first gaseous material in the output face is separated from at least one of the plurality of elongated output openings of the second gaseous material in the output face by at least one elongated exhaust opening in the output face which elongated exhaust opening is connected to an exhaust port in order to pull gaseous material from the region of the output face during deposition.

The plates may first be fabricated by a suitable means involving but not limited to the processes of stamping, embossing, molding, etching, photoetching, or abrasion.

A sealant or adhesive material can be applied to the surfaces of the plates in order to attach them together (step 502 of FIG. 18). Since these plates may contain fine patterning areas, it is critical that an adhesive application not apply an excess of adhesive that would block critical areas of the head during assembly. Alternatively, the adhesive can be applied in a patterned form so as not to interfere with critical areas of the internal structure, while still providing sufficient adhesion to allow mechanical stability. The adhesive can also be a byproduct of one of the process steps, such as residual photoresist on the plate surface after an etching process.

The adhesive or sealant can be selected from many known materials of that class such as epoxy based adhesives, silicone based adhesives, acrylate based adhesives, or greases.

The patterned plates can be arranged into the proper sequence to result in the desired association of inlet to output face elongated openings. The plates are typically assembled on some sort of aligning structure (step 504). This aligning structure can be any controlled surface or set of surfaces against which rest some surface of the plates, such that the plates as assembled will already be in a state of excellent alignment. A preferred aligning structure is to have a base portion with alignment pins, which pins are meant to interface with holes that exist in special locations on all of the plates. Preferably there are two alignment pins. Preferably one of these alignment holes is circular while the other is a slot to not over-constrain the parts during assembly.

Once all of the parts and their adhesive are assembled on the alignment structure, a pressure plate is applied to the structure and pressure and or heat are applied to cure the structure (step 506).

Although the alignment from the above mentioned pins already provides an excellent alignment of the structure, variations in the manufacturing process of the plates may result in the output face surface not being sufficiently flat for proper application. In such case, it may be useful to grind and polish the output face as a complete unit or order to obtain the desired surface finish (step 508). Finally, a cleaning step may be desired in order to permit operation of the deposition head without leading to contamination (step 600).

As will be understood by the skilled artisan, a flow diffuser such as described herein can be useful in a variety of devices used to distribute fluids onto a substrate, wherein the basic features comprise: (a) a first plate having a relief pattern portion; and (b) a second plate, wherein the first plate and the second plate are assembled to form an elongated output opening with a flow diffusing portion defined by the relief pattern portion, wherein flow diffusing portion is capable of diffusing the flow of a gaseous or liquid material. The use of such a flow diffuser essentially comprises diffusing the flow of a gaseous or liquid material through such a flow diffuser, the method of use comprising passing the gaseous or liquid material through a flow diffusing portion defined by the relief pattern portion formed by assembling a first plate having a relief pattern portion and a second plate, wherein the relief pattern portion is between facing plates and connects an elongated inlet opening and an elongated output opening for the flow of the gaseous or liquid material.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention.

PARTS LIST 10 delivery head
12 output channel
14, 16, 18 gas inlet conduit
20 substrate
22 exhaust channel
24 exhaust port conduit
36 output face
90 directing channel for precursor material
92 directing channel for purge gas
96 substrate support
100 connection plate
102 directing chamber
104 input port
110 gas chamber plate
112, 113, 115 supply chamber
114, 116 exhaust chamber
120 gas direction plate
122 directing channel for precursor material
123 exhaust directing channel
130 base plate
132 elongated emissive channel
134 elongated exhaust channel
140 gas diffuser plate assembly
150 delivery assembly
154 elongated exhaust channel
200 flat prototype plate
220 relief containing prototype plate
230 prototype plate containing relief patterns on both sides.
215 assembled plate unit
225 assembled plate unit
235 assembled plate unit
245 assembled plate unit
250 raised flat area of plate
255 directing channel recess
260 diffuser region on plate
265 cylindrical post
270 square post
275 arbitrary shaped post
300 machined block
305 supply lines in machined block
310 channels
315 first plate for horizontal diffuser assembly
320 second plate for horizontal diffuser assembly
325 diffuser area on horizontal plate
330 gas supply
335 diffused gas
350 vertical plate assembly end plates
360 supply holes
365 typical plate outline
370 vertical plate to connect supply line #2 to output face
375 vertical plate to connect supply line #5 to output face
380 vertical plate to connect supply line #4 to output face
385 vertical plate to connect supply line #10 to output face
390 vertical plate to connect supply line #7 to output face
395 vertical plate to connect supply line #8 to output face
405 recess for delivery channel on plate
410 diffuser area on plate
420 raised area in diffuser discrete channel
430 slots in diffuser discrete channel
450 double sided relief plate
455 seal plate with lip
460 lip on seal plate
465 diffuser area
500 step of fabricating plates
502 applying adhesive material to mating surfaces
504 mounting plates on aligning structure
506 applying pressure and head to cure
508 grinding and polishing active surfaces
600 cleaning
A arrow
D distance
E exhaust plate
F1, F2, F3, F4 gas flow
I third inert gaseous material
M second reactant gaseous material
O first reactant gaseous material
P purge plate
R reactant plate
S separator plate
X arrow

The invention claimed is:

1. A delivery head for deposition of a thin film of material onto a substrate comprising:
    (a) a plurality of inlet ports comprising at least a first, a second, and a third inlet port for receiving a first, a second, and a third gaseous material, respectively; and
    (b) an output face separated a distance from the substrate and comprising a first, a second, and a third plurality of substantially parallel elongated output openings, associated with each of the first, the second and the third inlet port, respectively, wherein the delivery head is designed to deliver the first, the second, and the third gaseous materials simultaneously and separately from the associated elongated output openings in the output face to the substrate, each elongated output opening having a length; and
    (c) a network of interconnecting supply chambers and directing channels for routing each of the first, the second, and the third gaseous materials from its corresponding inlet port to its corresponding elongated output openings;
    wherein for a given elongated output opening there is at least one gas diffusing channel connected to only the given elongated output opening, the gas diffusing channel being formed by two adjacent plates in which at least one of the two adjacent plates has a relief pattern through which one of the first, the second, and the third gaseous materials flows prior to flowing through the given elongated output opening in the output face, the relief pattern including structure that creates a gas flow backpressure that causes the flow of the first, second, or third gaseous materials to exit uniformly over the length of the given elongated output opening.

2. The delivery head of claim 1 wherein the relief pattern is variable within the area of the at least one gas diffusing channel.

3. The delivery head of claim 1 wherein the relief pattern is formed by a molding, embossing, etching, abrasion, mechanical machining, laser machining, or lithographic technique.

4. The delivery head of claim 1 wherein the relief pattern is random or ordered and wherein the relief pattern forms a substantially continuous network of microchannels separated by projections or separate microchannels separated by projections.

5. The delivery head of claim 1 wherein the relief pattern has been recessed from a surface of the at least one of two adjacent plates.

6. The delivery head of claim 1 wherein the relief pattern comprises projections within the area of the gas diffusing channel.

7. The delivery head of claim 1 wherein the at least one gas diffusing channel has an output opening which defines an associated elongated output opening.

8. The delivery head of claim 7 wherein the output opening of the at least one gas diffusing channel has an open area for gas flow of less that 0.0025 square inches per linear inch of the output opening.

9. The delivery head of claim 1 wherein each of the two adjacent plates has a relief pattern in a common area of the at least one gas diffusing channel.

10. The delivery head of claim 1 wherein the supply chambers and directing channels are also formed by two adjacent plates.

11. The delivery head of claim 1 wherein the at least one gas diffusing channel is capable of providing a friction factor that is greater than $1 \times 10^2$, assuming a representative gas that is nitrogen at 25° C. and a representative average velocity between 0.01 and 0.5 msec of gaseous material passing through the gas diffuser.

12. The delivery head of claim 1 wherein a plurality of gas diffusing channels is formed by a single pair of vertically overlying plates.

13. The delivery head of claim 12 wherein the supply chambers and directing channels are formed by a separate structure composed of a single machined block containing an internal channel structure.

14. The delivery head of claim 12 wherein the supply chambers and directing channels are formed by a separate structure composed of a structure containing at least two apertured vertically overlying plates.

15. The delivery head of claim 1 wherein the gas diffusing channel is constructed such that the gaseous flow path contains a deflection of at least 25 degrees from the average direction of gas flow at an inlet of the gas diffusing channel.

16. A deposition system wherein the delivery head of claim 1 is capable of providing thin film deposition of a solid material onto a substrate in a system in which a substantially uniform distance is maintained between an output face of the delivery head and the substrate surface during thin film deposition.

17. The deposition system of claim 16 wherein pressures generated due to flow of one or more of the gaseous materials from the delivery head to the substrate surface for thin film deposition provide at least part of the force separating the output face of the delivery head from the substrate surface.

18. The deposition system of claim 16 wherein a substrate support maintains the substrate surface at a separation distance of within 0.4 mm of the output face of the delivery head.

19. The deposition system of claim 16 wherein the substrate and the delivery head are open to the atmosphere.

* * * * *